(12) United States Patent
Takahashi

(10) Patent No.: US 6,420,255 B1
(45) Date of Patent: Jul. 16, 2002

(54) MOUNTING SUBSTRATE WITH A SOLDER RESIST LAYER AND METHOD OF FORMING THE SAME

(75) Inventor: Hisaya Takahashi, Toyama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/484,857

(22) Filed: Jan. 18, 2000

(30) Foreign Application Priority Data

Jan. 18, 1999 (JP) ............................................ 11-009375

(51) Int. Cl.[7] .............................................. H01L 21/44
(52) U.S. Cl. ...................... 438/613; 438/612; 438/614; 438/617
(58) Field of Search ................................ 438/612, 613, 438/614, 615, 616, 617; 228/180.1, 180.21, 180.22

(56) References Cited

U.S. PATENT DOCUMENTS

| | | | |
|---|---|---|---|
| 5,024,372 A | * 6/1991 | Altman et al. | ......... 228/180.22 |
| 5,341,564 A | * 8/1994 | Akhavain et al. | ........... 438/615 |
| 5,400,948 A | * 3/1995 | Saija et al. | ............... 228/180.1 |
| 5,672,260 A | * 9/1997 | Carey et al. | ........... 228/180.22 |
| 5,868,302 A | * 2/1999 | Onishi et al. | .......... 228/180.21 |
| 6,109,507 A | * 8/2000 | Yagi et al. | ............. 228/180.22 |

* cited by examiner

Primary Examiner—Kevin M. Picardat
(74) Attorney, Agent, or Firm—McGinn & Gibb,PLLC

(57) ABSTRACT

The present invention provides a substrate structure comprising: a plurality of electrodes provided on a substrate, each of the electrodes comprising an electrode pad on the substrate and a bump on the electrode pad; and a solder resist layer provided over the substrate, so that the solder resist layer extends in gaps between the electrodes and covers the electrode pads and the bumps except for at least top portions of the bumps, whereby top portions of the bumps are positioned higher than a surface of the solder resist layer to have the solder resist layer isolate adjacent two of the electrodes.

27 Claims, 34 Drawing Sheets

MOUNTING SUBSTRATE WITH A SOLDER RESIST LAYER AND METHOD OF FORMING THE SAME

BACKGROUND OF THE INVENTION

The present invention relates to a mounting substrate with a solder resist layer and a method of forming the same, and more particularly to a mounting substrate with a solder resist layer and with electrode pads on the substrate such as a printed wiring board and bumps including solder pre-coat on the electrode pads.

The screen printing method has been the majority method of forming the mounting substrate with a solder resist layer and with electrode pads on the substrate such as a printed wiring board and bumps including solder pre-coat on the electrode pads.

There are the following four methods of forming solder bumps. The first method is a plating method, where electrode pads are exposed to an electroless solder plating solution to apply a solder on surfaces of the electrode pads for subsequent fusing the same. The second method is a solder dip method, where a solder is supplied onto the surfaces of the electrode pads by a hot air leveler method. The third method is a paste printing method or a super solder method, where a printing mask such as a tetron screen, a metal mask, or a plastic mask is used to supply a solder paste by printing method for subsequent curing the same. The fourth method is a solder powder method, where solder powders are sprinkled onto an adhesion layer formed on pad portions to which a solder is to be supplied. This fourth method is disclosed in Japanese laid-open patent publication No. 7-74459.

The above four conventional methods have the following disadvantages. A large variation in amount of supplied solder onto each electrode pad is unavoidable. As a pitch of electrode pads is made narrower, a bridge may be formed between adjacent two pads.

In Japanese laid-open patent publication No. 4-173385, it is disclosed that a squeegee is used to print a cream solder through a film mask adhered on a substrate surface for subsequent removal of the used film mask.

In Japanese laid-open patent publication No. 6-350230, it is disclosed that on a first solder resist layer, a second solder layer is formed which is narrower than the first solder resist layer and then a solder resist layer is formed between electrode pads, where the solder resist layer is formed thicker than the electrode pads to prevent formation of any solder bridge.

In Japanese laid-open patent publication No. 10-350230, it is disclosed that a gap is formed between a solder dam and an electrode pad to reduce a percent defective in mounting the device The above Japanese publications are, however, silent on how to prevent formation of the solder bridge between adjacent pads having a fine pitch wherein bumps are formed on the electrode pads which are formed on a mounting substrate with a solder resist layer.

In the above circumstances, it had been required to develop a novel mounting substrate with a solder resist layer free from the above problem.

SUMMARY OF THE INVENTION

Accordingly, it is an object of the present invention to provide a novel mounting substrate with a solder resist layer electrode pads on the mounting substrate and solder or metal bumps on the electrode pads free from the above problems.

It is a further object of the present invention to provide a novel mounting substrate with a solder resist layer electrode pads on the mounting substrate and solder or metal bumps on the electrode pads at a small pitch without any bridge between adjacent bumps.

It is a still further object of the present invention to provide a novel method of forming a mounting substrate with a solder resist layer electrode pads on the mounting substrate and solder or metal bumps on the electrode pads free from the above problems.

It is yet a further object of the present invention to provide a novel method of forming a mounting substrate with a solder resist layer electrode pads on the mounting substrate and solder or metal bumps on the electrode pads at a small pitch without any bridge between adjacent bumps.

The present invention provides a substrate structure comprising: a plurality of electrodes provided on a substrate, each of the electrodes comprising an electrode pad on the substrate and a bump on the electrode pad; and a solder resist layer provided over the substrate, so that the solder resist layer extends in gaps between the electrodes and covers the electrode pads and the bumps except for at least top portions of the bumps, whereby top portions of the bumps are positioned higher than a surface of the solder resist layer to have the solder resist layer isolate adjacent two of the electrodes.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
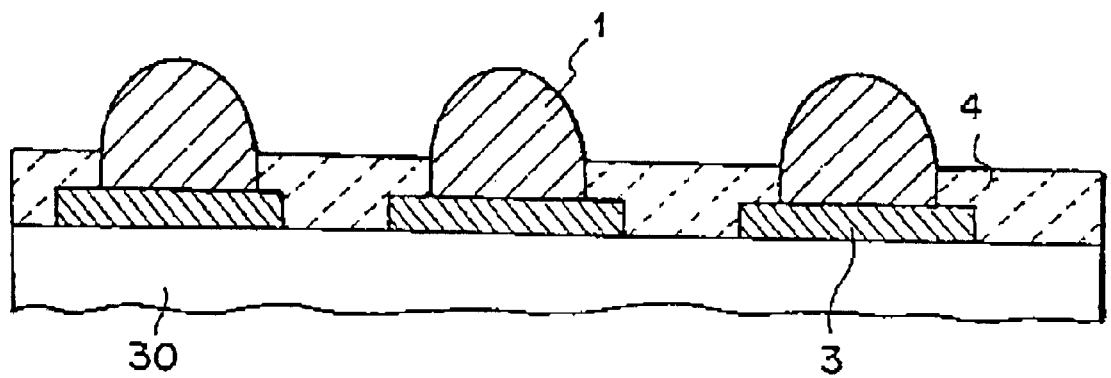
FIG. 1 is a fragmentary cross sectional elevation view illustrative of a plurality of electrode pads are provided on a surface of a wiring board in first and second embodiments in accordance with the present invention.

The first present invention provides a substrate structure comprising: a plurality of electrodes provided on a substrate, each of the electrodes comprising an electrode pad on the substrate and a bump on the electrode pad; and a solder resist layer provided over the substrate, so that the solder resist layer extends in gaps between the electrodes and covers the electrode pads and the bumps except for at least top portions of the bumps, whereby top portions of the bumps are positioned higher than a surface of the solder resist layer to have the solder resist layer isolate adjacent two of the electrodes.

It is also preferable that the top portions of the bumps have a uniform top level higher than the surface of the solder resist layer.

It is also preferable that the bumps comprise solder bumps.

It is also preferable that the bumps comprise metal bumps.

It is also preferable that a surface of each of the bumps projecting from the surface of the solder resist layer is coated with a surface layer.

The second present invention provides a method of supplying a paste in openings formed over electrode pads on a substrate by use of a mask of an etching dry film formed on a solder resist layer, wherein each of the openings comprises a first opening portion formed in a solder resist layer and a second opening portion formed in the mask.

It is preferable that the first and second opening portions are formed after the etching dry film is formed on the solder resist layer It is also preferable that the first and second opening portions have the same diameters as each other.

It is also preferable that after the first opening portions are formed in the solder resist layer, the etching dry film is formed on the solder resist layer and over the first opening portions before the second opening portions are then formed in the etching dry film. It is further preferable that the second opening portions have a larger diameter than the first opening portions. It is also preferable that the second opening portions are formed in the etching dry film by exposure to the etching dry film with using of an exposure mask and a subsequent development thereof.

It is also preferable that a squeegee is used to supply the paste into the openings.

It is also preferable that after the paste is supplied in the openings, the paste is pressed to remove foams from the paste and a fresh paste is additionally supplied to completely fill the openings with the paste.

It is also preferable that the paste comprises a solder bump paste.

It is also preferable that the paste comprises a metal bump paste.

The third present invention provides a method of a substrate structure. The method comprises the steps of:
  forming electrode pads on a substrate;
  forming a solder resist layer over the substrate so as to completely cover the electrode pads;
  forming an etching dry film on the solder layer;
  forming first opening portions in the solder resist layer and second opening portions in the etching dry film to form openings comprising the first and second opening portions which have the same size as each other, so that the openings are positioned over the electrode pads;
  supplying pastes in the openings by use a mask of the etching dry film;
  making the pastes into solders to form the solders in the openings; and
  removing the etching dry film.

It is preferable that a squeegee is used to supply the pastes into the openings.

It is also preferable that after the paste is supplied in the openings, the paste is pressed to remove foams from the paste and a fresh paste is additionally supplied to completely fill the openings with the paste, It is also preferable that the paste comprises a solder bump paste.

It is also preferable that the paste comprises a metal bump paste.

It is also preferable to further comprise a step of forming a surface layer on a surface of each of the bumps projecting from a surface of the solder resist layer.

The fourth present invention provides a method of a substrate structure. The method comprises the steps of:
  forming electrode pads on a substrate;
  forming a solder resist layer over the substrate so as to completely cover the electrode pads;
  forming first opening portions in the solder resist layer so that the first opening portions are positioned over the electrode pads;
  forming an etching dry film on the solder layer and over the first opening portions;
  forming second opening portions in the etching dry film over the first opening portions to form openings comprising the first and second opening portions;
  supplying pastes in the openings by use a mask of the etching dry film;
  making the pastes into solders to form the solders in the openings; and
  removing the etching dry film.

It is preferable that a squeegee is used to supply the pastes into the openings.

It is also preferable that after the paste is supplied in the openings, the paste is pressed to remove foams from the paste and a fresh paste is additionally supplied to completely fill the openings with the paste.

It is also preferable that the second opening portions are formed in the etching dry film by exposure to the etching dry film with using of an exposure mask and a subsequent development thereof.

It is also preferable that the paste comprises a solder bump paste.

It is also preferable that the paste comprises a metal bump paste.

It is also preferable to further comprise a step of forming a surface layer on a surface of each of the bumps projecting from a surface of the solder resist layer.

Preferred Embodiment

First Embodiment

A first embodiment according to the present invention will be described in detail with reference to the drawings. There will be described a novel mounting substrate with a solder resist layer electrode pads on the mounting substrate and solder or metal bumps on the electrode pads.

FIG. 1 is a fragmentary cross sectional elevation view illustrative of a plurality of electrode pads 3 are provided on a surface of a wiring board 30. Solder bumps 1 are provided on the electrode pads 3. An electrode comprises the electrode pad 3 and the solder bump 1. A solder resist layer 4 is provided which extends on the wiring board 30 to fill gaps between the electrodes, so that the electrode pads 3 and lower portions of the solder bumps 1 are coated within the solder resist layer 4. Tops of the solder bumps 1 are projected from the surface of the solder resist layer 4. A height of the individual tops of the solder bumps 1 from the surface of the solder resist layer 4 is uniform. It may be possible to form a surface layer on a surface of each of the solder bumps 1, wherein the surface layer may comprise a water-soluble pre-flux layer, a nickelgold plated layer, a tin plated layer, a tin-silver plated layer or a palladium plated layer. The solder resist layer 4 comprises a permanent resin layer. The solder resist layer 4 mat further include other resin layer such as an additive plated resist layer.

The tops of the solder bumps 1 have a uniform height from the surface of the solder resist layer 4. Further, the solder resist layer 4 is provided which extends in gaps between adjacent electrodes. For those reasons, no short circuit such as bridge between adjacent electrodes is formed whereby a soldering workability is improved.

FIGS. 4A through 4I are fragmentary cross sectional elevation view illustrative of a novel method of forming a mounting substrate with a solder resist and with electrode pads on the mounting substrate and solder bumps on the electrode pads shown in FIG. 1.

Figure 4:
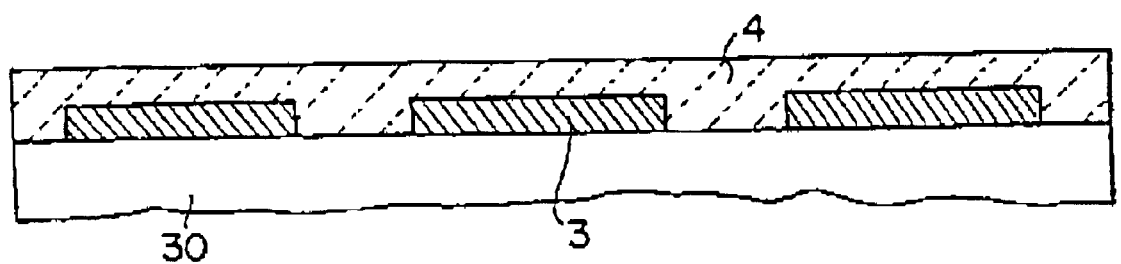
FIGS. 4A through 4I are fragmentary cross sectional elevation view illustrative of a novel method of forming a mounting substrate with a solder resist and with electrode pads on the mounting substrate and solder bumps on the electrode pads shown in FIG. 1 in a first embodiment in accordance with the present invention.
Figure 4:
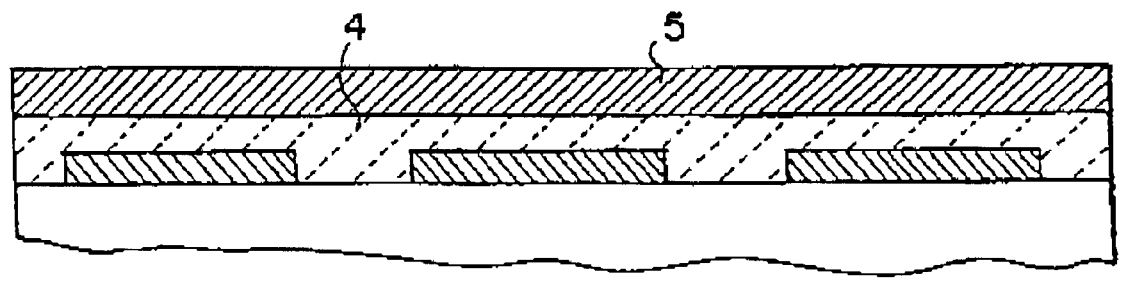
Figure 4:
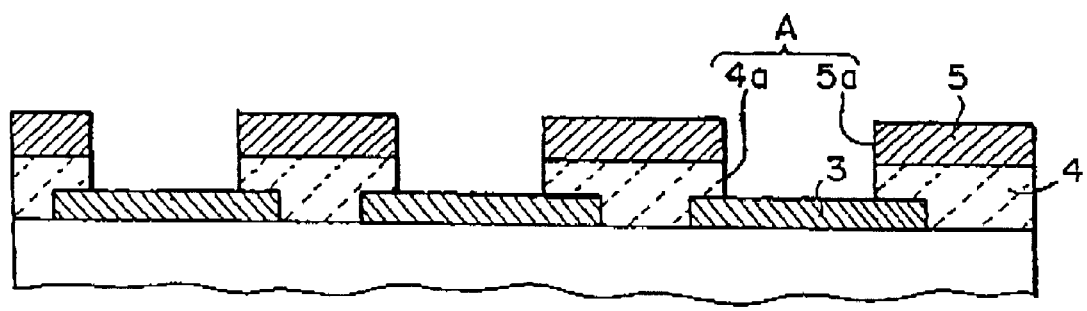
Figure 4:
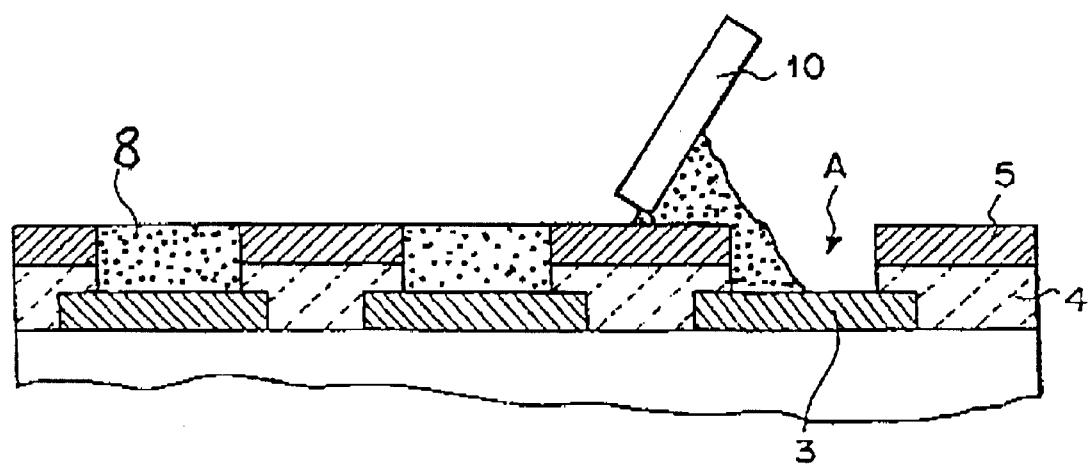
Figure 4:
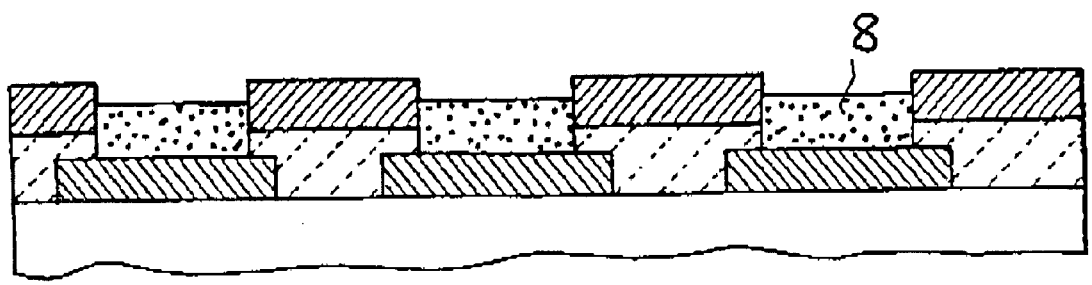
Figure 4:
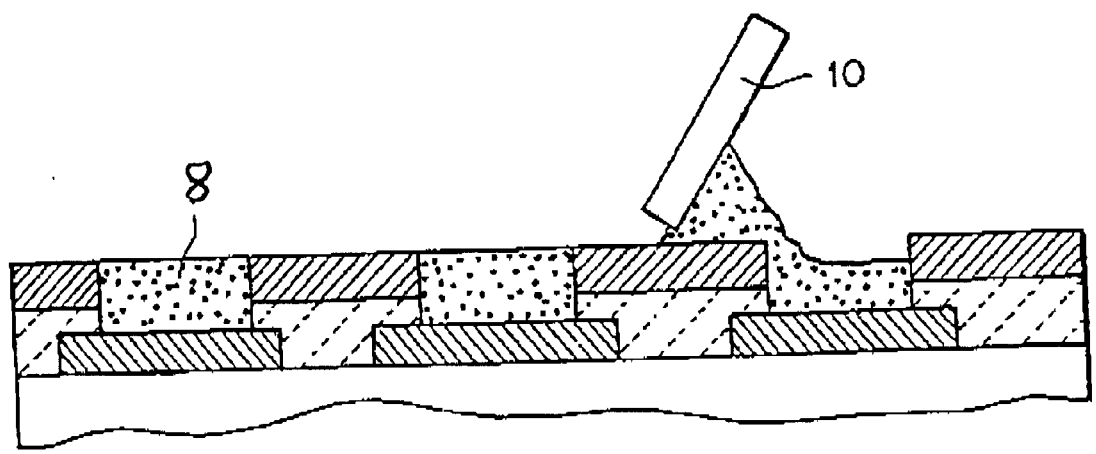
Figure 4:
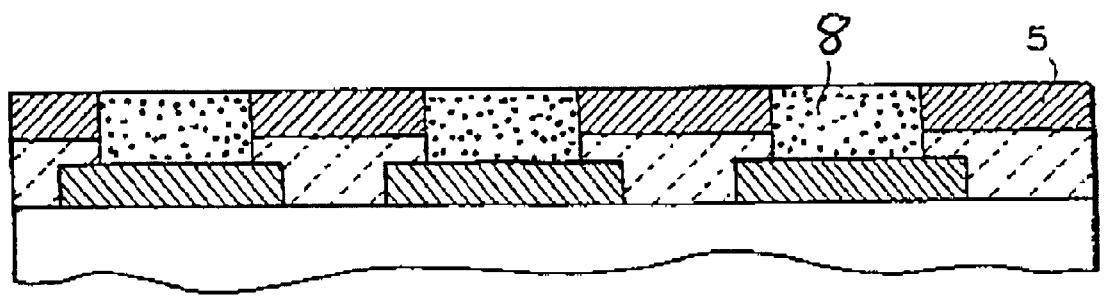
Figure 4:
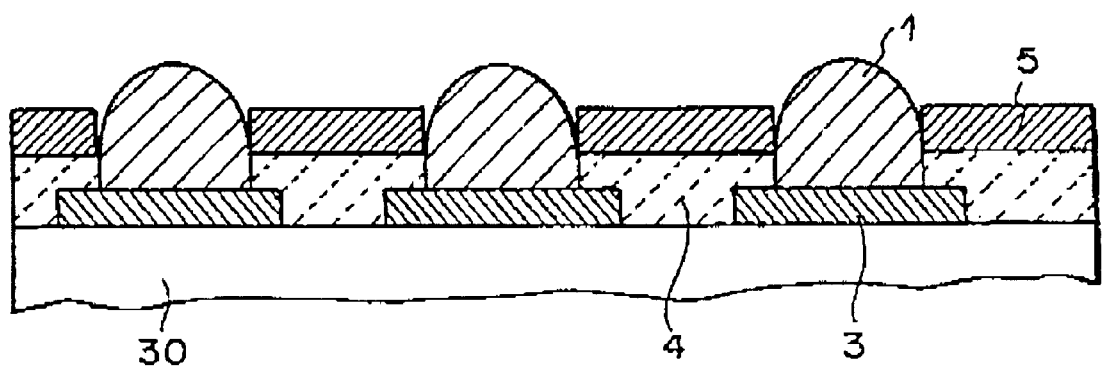
Figure 4:
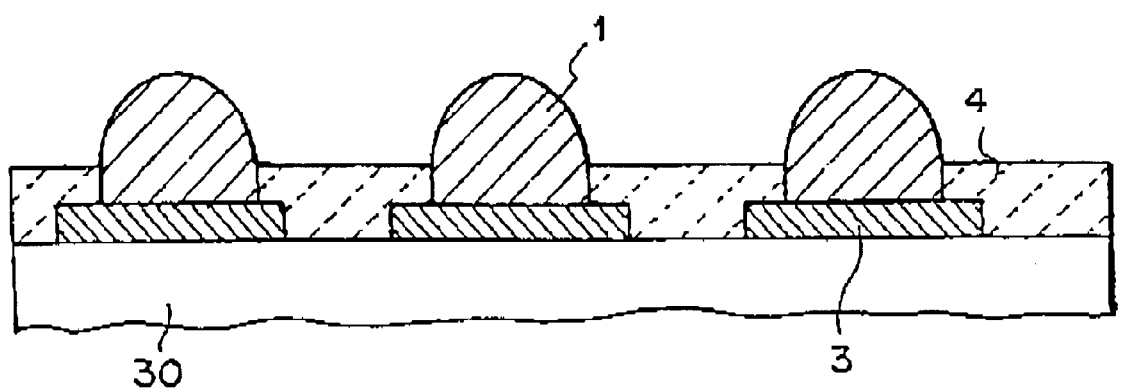

With reference to FIG. 4A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermo-setting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the solder bumps 1, wherein the surface layer may comprise a water-soluble pre-flux layer, a nickel-gold plated layer, a tin plated layer, a tin-silver plated layer or a palladium plated layer.

With reference to FIG. 4B, an etching dry film 5 is formed on the solder resist layer 4B. The etching dry film 5 may, for example, comprise an alkali-soluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a solder bump paste fills the openings. Further more alternatively, the Mylar film may be removed after A re-flow process for the solder bump paste.

With reference to FIG. 4C, a laser beam machining is used to form openings "A" which penetrate the etching dry film 5 and the solder resist layer 4 so that the openings "A" are positioned over the electrode pads 3, whereby a center portion of a surface of each of the electrode pads 3 is shown through the opening "A". A diameter of a size of the opening "A" is smaller than the electrode pad 3. The opening "A" comprises a first opening portion 4a formed in the solder resist layer 4 and a second opening portion 5a formed in the etching dry film 5. The formation of the first opening portion 4a follows the formation of the second opening portion 5a.

With reference to FIG. 4D, a squeegee 10 is used to print-supply a solder bump paste 8 into the openings "A" so that the openings "A" are filled with the solder bump taste 8.

With reference to FIG. 4E, the solder bump paste 8 is pressed under a pressure of not less than 6 Kgf/cm2 for not less than 10 minutes by use of an autoclave to remove foams from the solder bump paste 8 whereby a volume of the solder bump paste 8 is reduced.

With reference to FIG. 4F, the squeegee 10 is again used to print-supply the solder bump paste 8 into the openings "A" so that the openings "A" are completely filled with the solder bump taste 8.

With reference to FIG. 4G, the solder bump paste 8 is again pressed under the pressure of not less than 6 Kgf/cm2 for not less than 10 minutes by use of the autoclave to remove foams from the solder bump paste 8 whereby the volume of the solder bump paste 8 is reduced. The processes of FIGS. 4D through 4F are repeated until a top level of the solder bump paste 8 corresponds to the top level of the etching dry film 5.

With reference to FIG. 4H, a re-flow process is carried out to the solder paste 8 for subsequent curing the same to form solder bumps 1 in the openings "A".

With reference to FIG. 4I, an alkali solvent such as a sodium hydrate or an organic solvent, for example, ethanol amine, is used to remove the etching dry film 5. A cleaning process is then carried out to form a mounting substrate.

A paste-printing is carried out by use of the dry film 5 over the solder resist layer 4 as a mask, for which reason even if the wiring board or substrate has a bending or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film 5 at a high accuracy, without using any further instrument.

Second Embodiment

A second embodiment according to the present invention will be described in detail with reference to the drawings. The second embodiment is different only in the method of forming the mounting substrate from the first embodiment. The following descriptions will focus on the method of forming the mounting substrate.

FIGS. 5A through 5J are fragmentary cross sectional elevation view illustrative of a novel method of forming a mounting substrate with a solder resist and with electrode pads on the mounting substrate and solder bumps on the electrode pads shown in FIG. 1.

Figure 5:
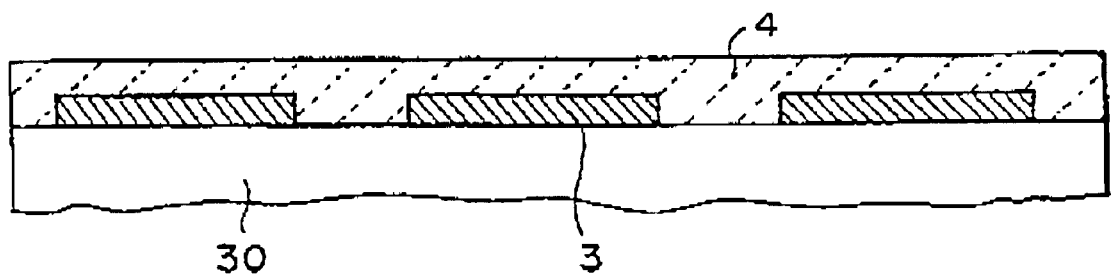
FIGS. 5A through 5J are fragmentary cross sectional elevation view illustrative of a novel method of forming a mounting substrate with a solder resist and with electrode pads on the mounting substrate and solder bumps on the electrode pads shown in FIG. 1 in a second embodiment in accordance with the present invention.
Figure 5:
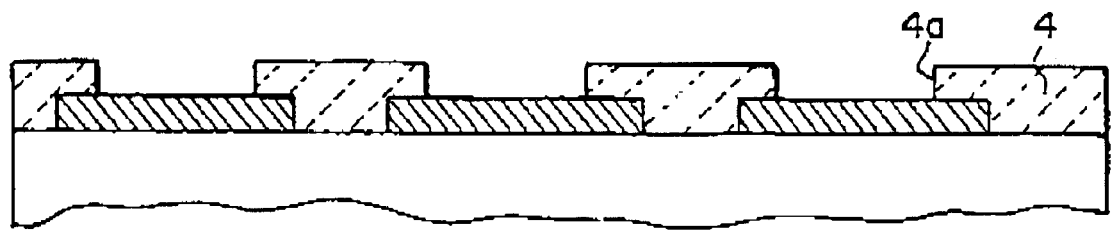
Figure 5:
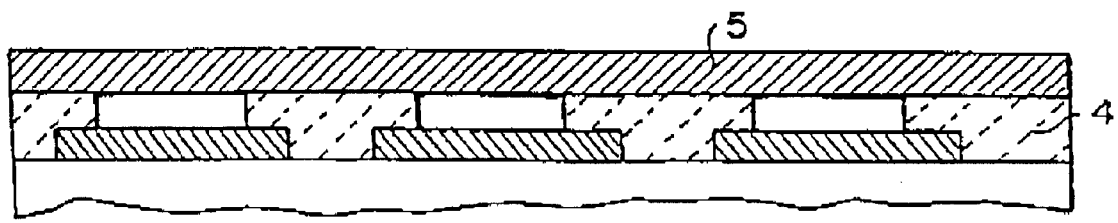
Figure 5:
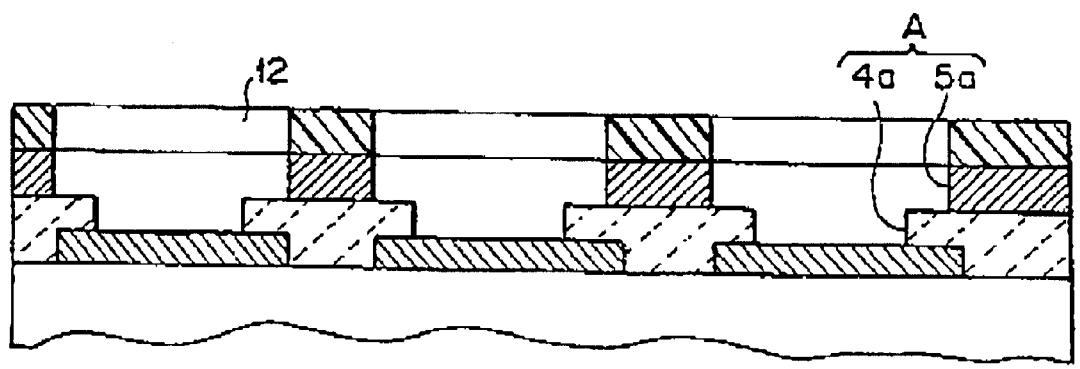
Figure 5:
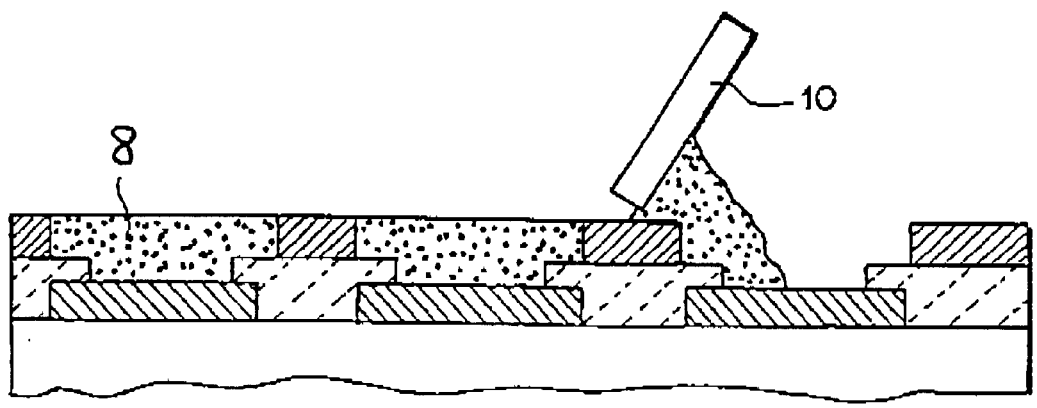
Figure 5:
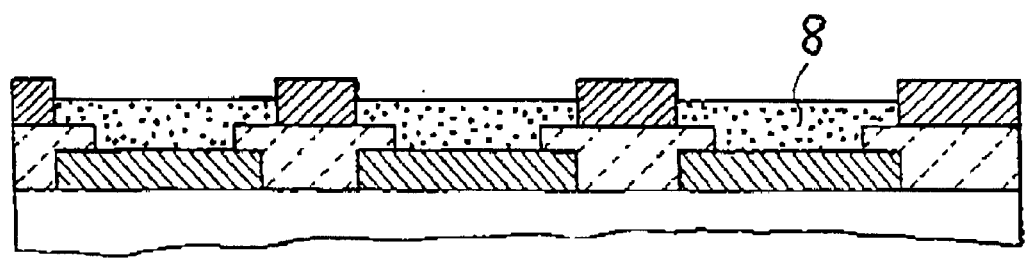
Figure 5:
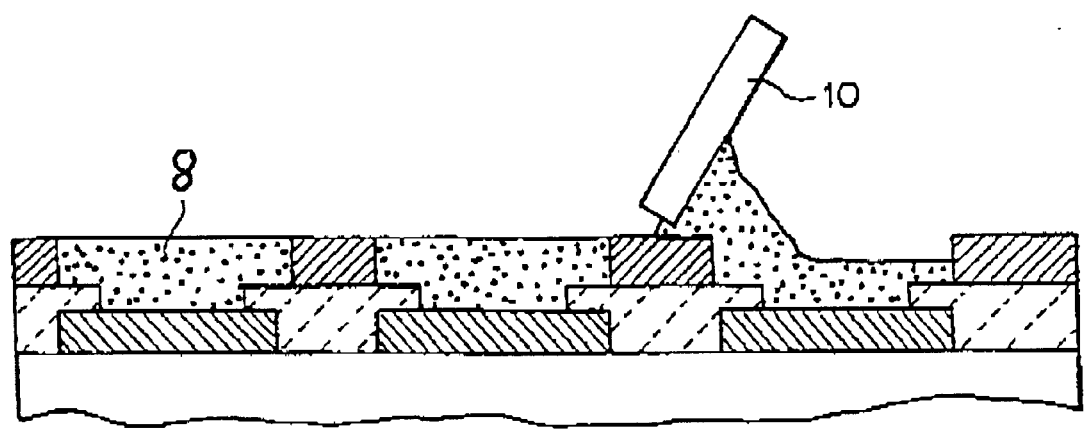
Figure 5:
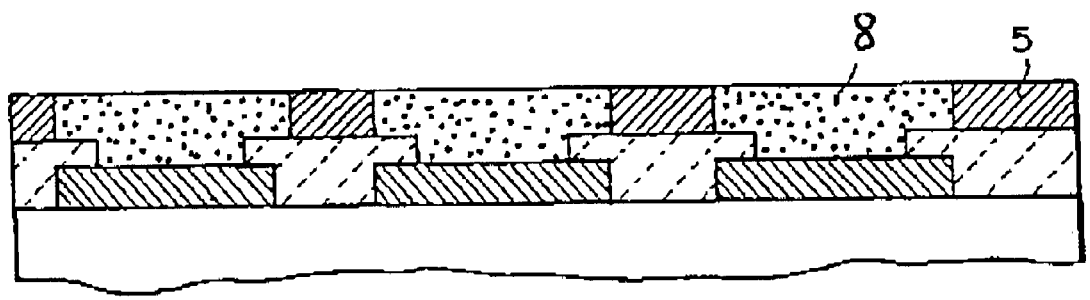
Figure 5:
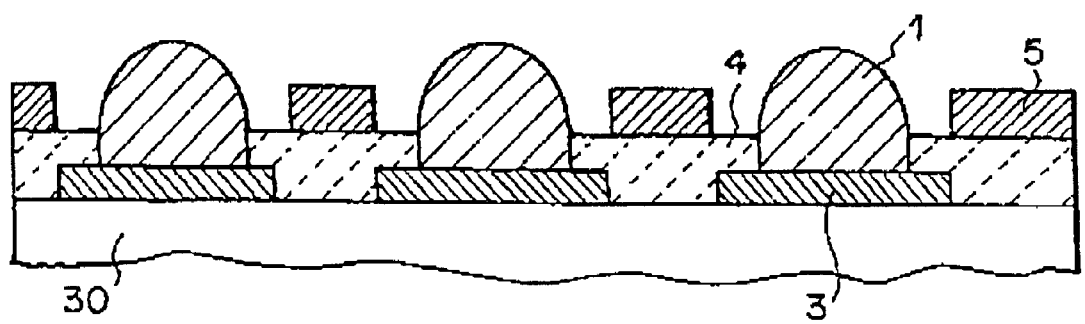

With reference to FIG. 5A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermo-setting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the solder bumps 1, wherein the surface layer may comprise a water-soluble pre-flux layer, a nickel-gold plated layer, a tin plated layer, a tin-silver plated layer or a palladium plated layer.

With reference to FIG. 5B, a laser beam machining is used to form openings 4a which penetrate the solder resist layer 4 so that the openings 4a are positioned over the electrode pads 3, whereby a center portion of a surface of each of the electrode pads 3 is shown through the opening 4a. A diameter of a size of the opening 4a is smaller than the electrode pad 3.

With reference to FIG. 5C, an etching dry film 5 is formed on the solder resist layer 4 and over the openings 4a. The etching dry film 5 may, for example, comprise an alkali-isoluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a solder bump paste fills the openings. Further more alternatively, the Mylar film may be removed after a re-flow process for the solder bump paste.

With reference to FIG. 5D, an exposure mask 12 is formed on the etching dry film 5 so that an exposure to the etching dry film 5 and a subsequent development thereof are carried out by use of the exposure mask 12 so as to form openings 5a in the etching dry film 5 over the openings 4a. The openings 5a have a larger diameter than a diameter of the openings 4a. Openings "A" are therefore formed, wherein each of the openings "A" comprises the first opening 4a formed in the solder resist layer 4 and the second opening 5a formed in the etching dry film 5. The used exposure mask 12 is removed.

With reference to FIG. 5E, a squeegee 10 is used to print-supply a solder bump paste 8 into the openings "A" so that the openings "A" are filled with the solder bump taste 8.

With reference to FIG. 5F, the solder bump paste 8 is pressed under a pressure of not less than 6 Kgf/cm2 for not less than 10 minutes by use of an autoclave to remove foams from the solder bump paste 8 whereby a volume of the solder bump paste 8 is reduced.

With reference to FIG. 5G, the squeegee 10 is again used to print-supply the solder bump paste 8 into the openings "A" so that the openings "A" are completely filled with the solder bump taste 8.

With reference to FIG. 5H, the solder bump paste 8 is again pressed under the pressure of not less than 6 Kgf/cm2 for not less than 10 minutes by use of the autoclave to remove foams from the solder bump paste 8 whereby the volume of the solder bump paste 8 is reduced. The processes of FIGS. 5E through 5G are repeated until a top level of the solder bump paste 8 corresponds to the top level of the etching dry film 5.

With reference to FIG. 5I, a re-flow process is carried out to the solder paste 8 for subsequent curing the same to form solder bumps 1 in the openings "A". The re-flow process causes a cohesion of the solder paste 8 whereby the solder bumps 1 have almost the same size as the first openings 4a formed in the solder resist layer 4.

Figure 5J:
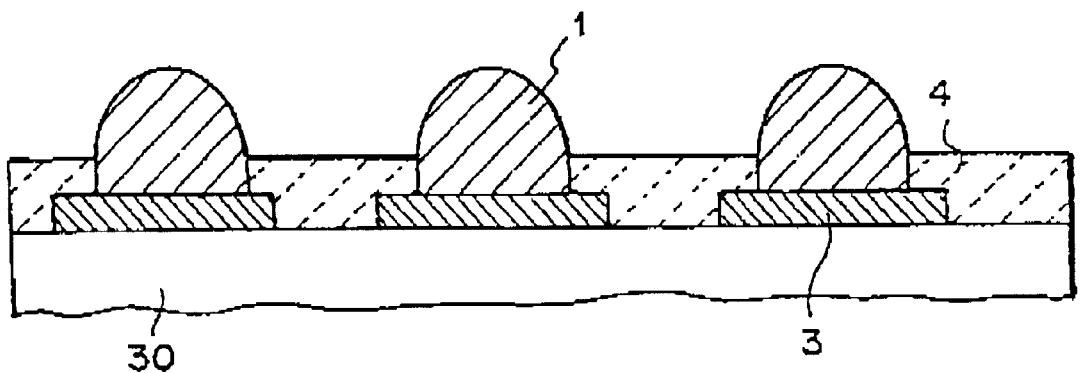

With reference to FIG. 5J, an alkali solvent such as a sodium hydrate or an organic solvent, for example, ethanol amine, is used to remove the etching dry film 5. A cleaning process is then carried out to form a mounting substrate.

A paste-printing is carried out by use of the dry film 5 over the solder resist layer 4 as a mask, for which reason even if the wiring board or substrate has a bending or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film 5 at a high accuracy, without using any further instrument.

Third Embodiment

A third embodiment according to the present invention will be described in detail with reference to the drawings. There will be described a novel mounting substrate with a solder resist layer electrode pads on the mounting substrate and solder or metal bumps on the electrode pads.

Figure 2:
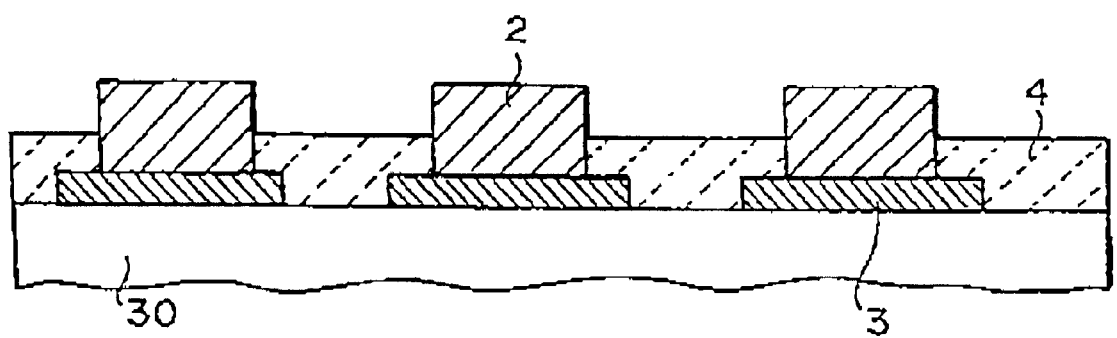
FIG. 2 is a fragmentary cross sectional elevation view illustrative of a plurality of electrode pads are provided on a surface of a wiring board in third and fourth embodiments in accordance with the present invention.

FIG. 2 is a fragmentary cross sectional elevation view illustrative of a plurality of electrode pads 3 are provided on a surface of a wiring board 30. Metal bumps 2 are provided on the electrode pads 3. An electrode comprises the electrode pad 3 and the metal bump 2. A solder resist layer 4 is provided which extends on the wiring board 30 to fill gaps between the electrodes, so that the electrode pads 3 and lower portions of the metal bumps 2 are coated within the solder resist layer 4. Tops of the metal bumps 2 are projected from the surface of the solder resist layer 4. A height of the individual tops of the metal bumps 2 from the surface of the solder resist layer 4 is uniform. The solder resist layer 4 comprises a permanent resin layer. The solder resist layer 4 mat further include other resin layer such as an additive plated resist layer.

The tops of the metal bumps 2 have a uniform height from the surface of the solder resist layer 4. Further, the solder resist layer 4 is provided which extends in gaps between adjacent electrodes. For those reasons, no short circuit such as bridge between adjacent electrodes is formed whereby a soldering workability is improved.

FIGS. 6A through 6I are fragmentary cross sectional elevation view illustrative of a novel method of forming a mounting substrate with a solder resist and with electrode pads on the mounting substrate and metal bumps on the electrode pads shown in FIG. 2.

Figure 6:
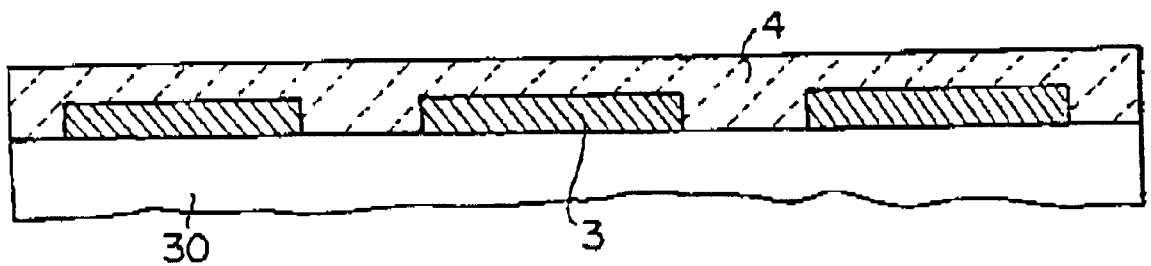
FIGS. 6A through 6I are fragmentary cross sectional elevation view illustrative of a novel method of forming a mounting substrate with a solder resist and with electrode pads on the mounting substrate and metal bumps on the electrode pads shown in FIG. 2 in a third embodiment in accordance with the present invention.
Figure 6:
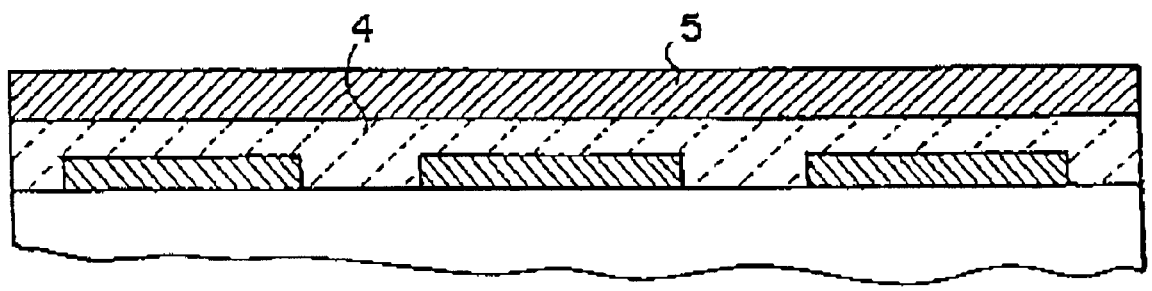
Figure 6:
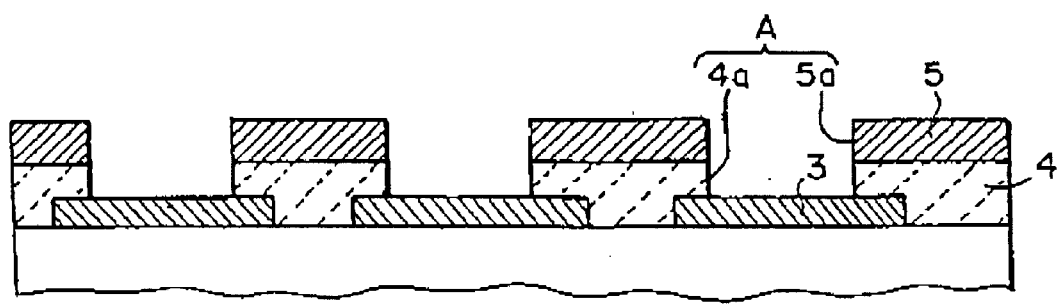
Figure 6:
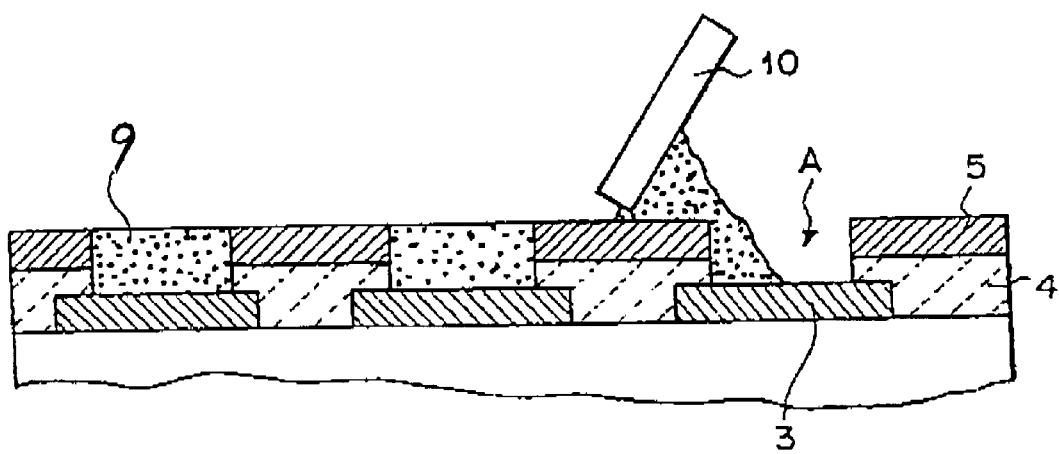
Figure 6:
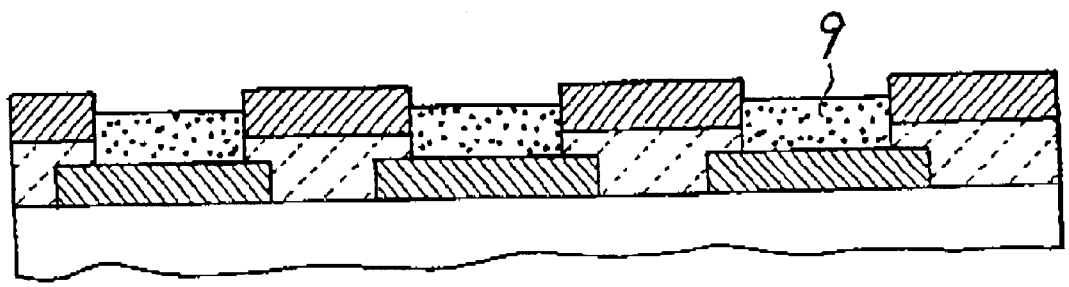
Figure 6:
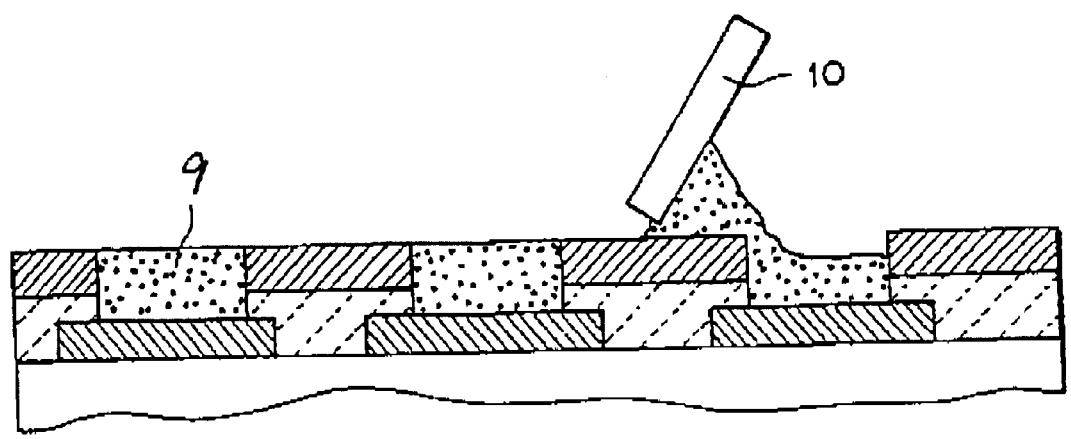
Figure 6:
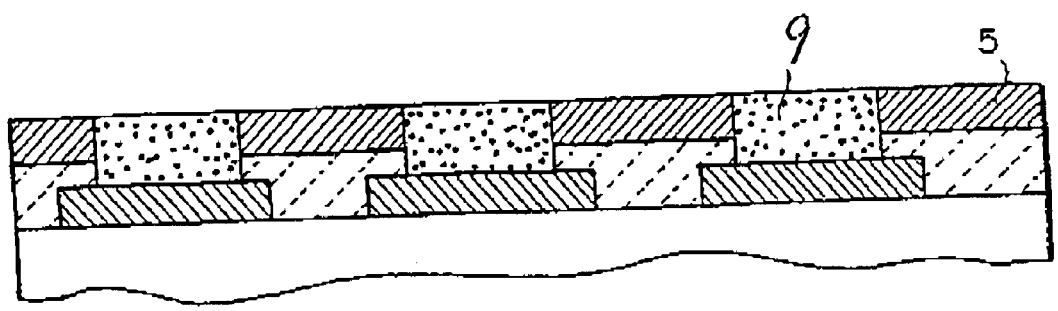
Figure 6:
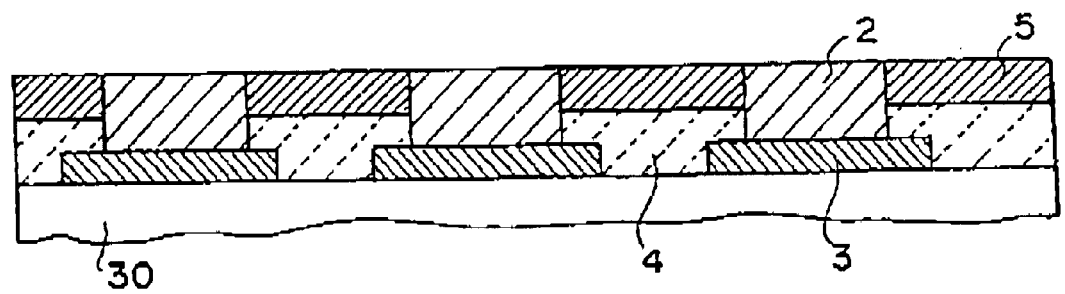
Figure 6:
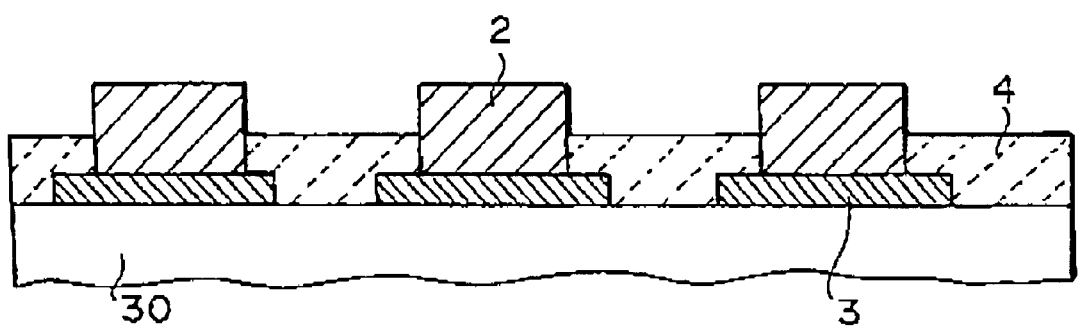

With reference to FIG. 6A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermosetting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the metal bumps 2, wherein the surface layer may comprise a water-soluble pre-flux layer, a nickel-gold plated layer, a tin plated layer, a tin-silver plated layer or a palladium plated layer.

With reference to FIG. 6B, an etching dry film 5 is formed on the solder resist layer 4. The etching dry film 5 may, for example, comprise an alkali-soluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a metal bump paste fills the openings. Further more alternatively, the Mylar film may be removed after a re-flow process for the metal bump paste.

With reference to FIG. 6C, a laser beam machining is used to form openings "A" which penetrate the etching dry film 5 and the solder resist layer 4 so that the openings "A" are positioned over the electrode pads 3, whereby a center portion of a surface of each of the electrode pads 3 is shown through the opening "A". A diameter of a size of the opening "A" is smaller than the electrode pad 3. The opening "A" comprises a first opening portion 4a formed in the solder resist layer 4 and a second opening portion 5a formed in the etching dry film 5. The formation of the first opening portion 4a follows the formation of the second opening portion 5a.

With reference to FIG. 6D, a squeegee 10 is used to print-supply a metal bump paste 9 into the openings "A" so that the openings "A" are filled with the metal bump taste 9.

With reference to FIG. 6E, the metal bump paste 9 is pressed under a pressure of not less than 6 Kgf/cm2 for not less than 10 minutes by use of an autoclave to remove foams from the metal bump paste 9 whereby a volume of the metal bump paste 9 is reduced.

With reference to FIG. 6F, the squeegee 10 is again used to print-supply the metal bump paste 9 into the openings "A" so that the openings "A" are completely filled with the metal bump taste 9.

With reference to FIG. 6G, the metal bump paste 9 is again pressed under the pressure of not less than 6 Kgf/cm2 for not less than 10 minutes by use of the autoclave to remove foams from the metal bump paste 9 whereby the volume of the metal bump paste 9 is reduced. The processes of FIGS. 6D through 6F are repeated until a top level of the metal bump paste 9 corresponds to the top level of the etching dry film 5.

With reference to FIG. 6H, a baking is carried out to the solder paste 9 to form metal bumps 2 in the openings "A". With reference to FIG. 6I, an alkali solvent such as a sodium hydrate or an organic solvent, for example, ethanol amine, is used to remove the etching dry film 5. A cleaning process is then carried out to form a mounting substrate.

A paste-printing is carried out by use of the dry film 5 over the solder resist layer 4 as a mask, for which reason even if the wiring board or substrate has a bonding or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film 5 at a high accuracy, without using any further instrument.

Fourth Embodiment

A fourth embodiment according to the present invention will be described in detail with reference to the drawings. The fourth embodiment is different only in the method of forming the mounting substrate from the third embodiment. The following descriptions will focus on the method of forming the mounting substrate.

FIGS. 7A through 7J arc fragmentary cross sectional elevation view illustrative of a novel method of forming a mounting substrate with a solder resist and with electrode pads on the mounting substrate and metal bumps on the electrode pads shown in FIG. 2.

Figure 7A:
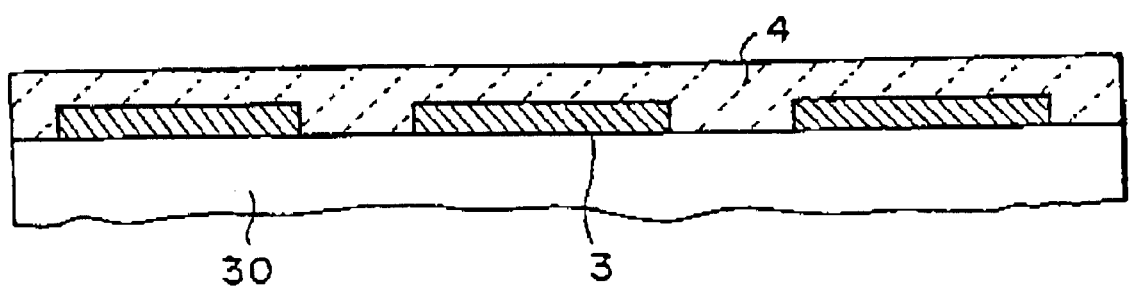
FIGS. 7A through 7J are fragmentary cross sectional elevation view illustrative of a novel method of forming a mounting substrate with a solder resist and with electrode pads on the mounting substrate and metal bumps on the electrode pads shown in FIG. 2 in a fourth embodiment in accordance with the present invention.

With reference to FIG. 7A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermosetting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the metal bumps 2, wherein the surface layer may comprise a water-soluble pre-flux layer, a nickel-gold plated layer, a tin plated layer, a tin-silver plated layer or a palladium plated layer.

Figure 7B:
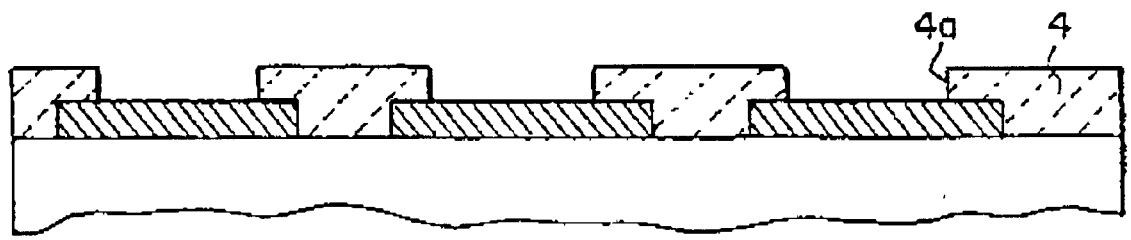

With reference to FIG. 7B, a laser beam machining is used to form openings 4a which penetrate the solder resist layer 4 so that the openings 4a are positioned over the electrode pads 3, whereby a center portion of a surface of each of the electrode pads 3 is shown through the opening 4a. A diameter of a size of the opening 4a is smaller than the electrode pad 3.

Figure 7C:
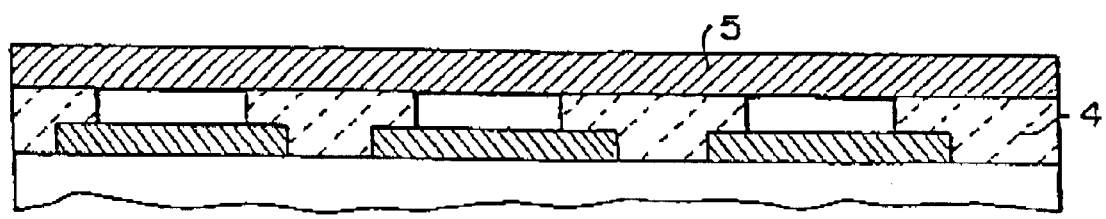

With reference to FIG. 7C, an etching dry film 5 is formed on the solder resist layer 4 and over the openings 4a. The etching dry film 5 may, for example, comprise an alkali-soluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a metal bump paste fills the openings. Further more alternatively, the Mylar film may be removed after a re-flow process for the metal bump paste.

Figure 7D:
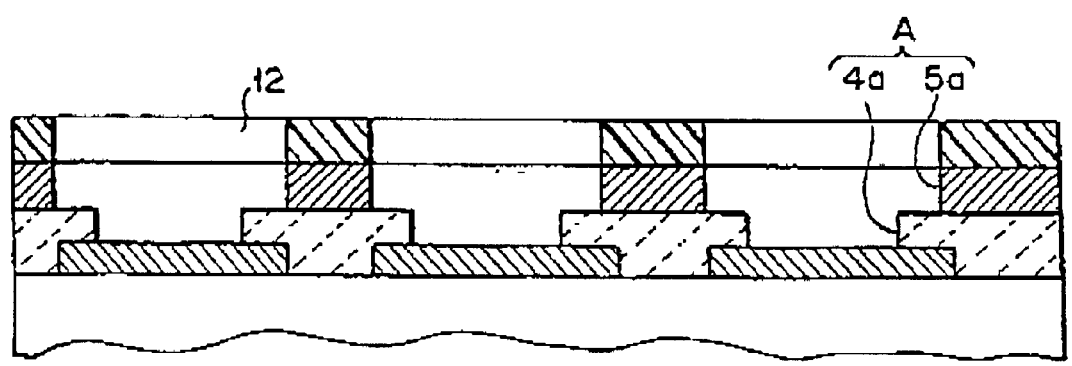

With reference to FIG. 7D, an exposure mask 12 is formed on the etching dry film 5 so that an exposure to the etching dry film 5 and a subsequent development thereof are carried out by use of the exposure mask 12 so as to form openings 5a in the etching dry film 5 over the openings 4a. The openings 5a have a larger diameter than a diameter of the openings 4a. Openings "A" are therefore formed, wherein each of the openings "A" comprises the first opening 4a formed in the solder resist layer 4 and the second opening 5a formed in the etching dry film 5. The used exposure mask 12 is removed.

Figure 7E:
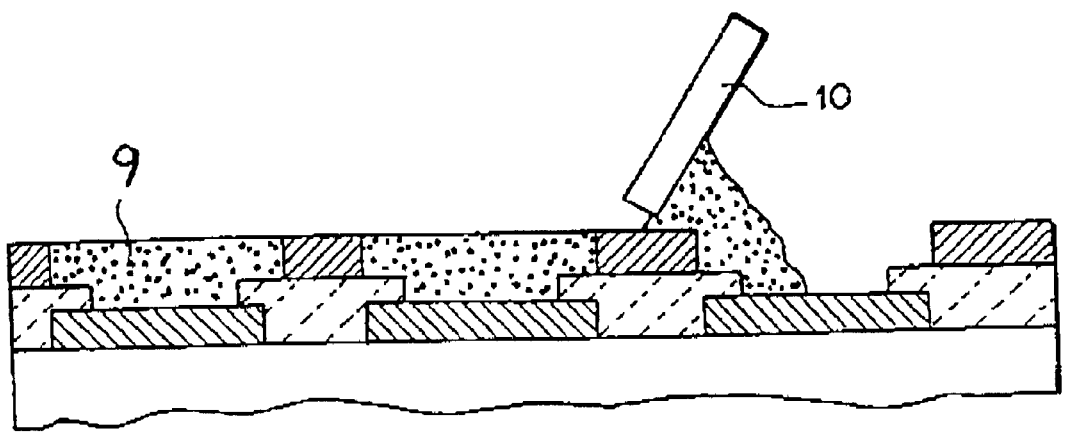

With reference to FIG. 7E, a squeegee 10 is used to print-supply a metal bump paste 9 into the openings "A" so that the openings "A" are filled with the metal bump taste 9.

With reference to FIG. 7P, the metal bump paste 9 is pressed under a pressure of not less than 6 Kgf/cm2 for not less than 10 minutes by use of an autoclave to remove foams from the metal bump paste 9 whereby a volume of the metal bump paste 9 is reduced.

Figure 7F:
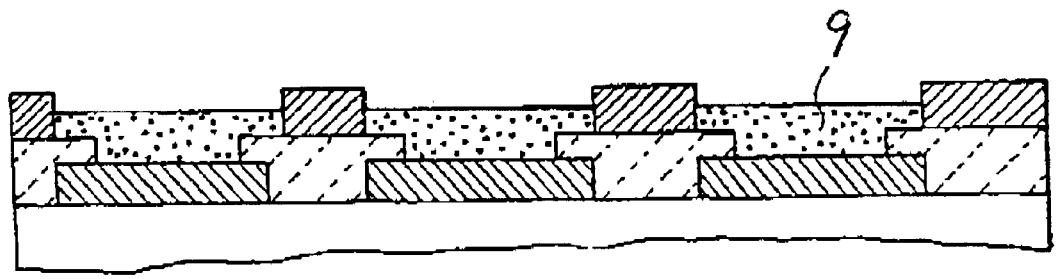
Figure 7G:
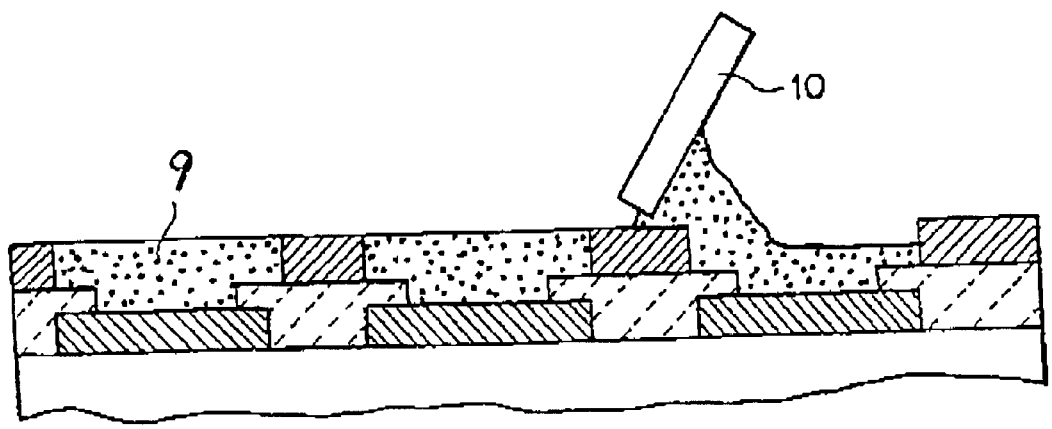

With reference to FIG. 7G, the squeegee 10 is again used to print-supply the metal bump paste 9 into the openings "A" so that the openings "A" are completely filled with the metal bump taste 9.

Figure 7H:
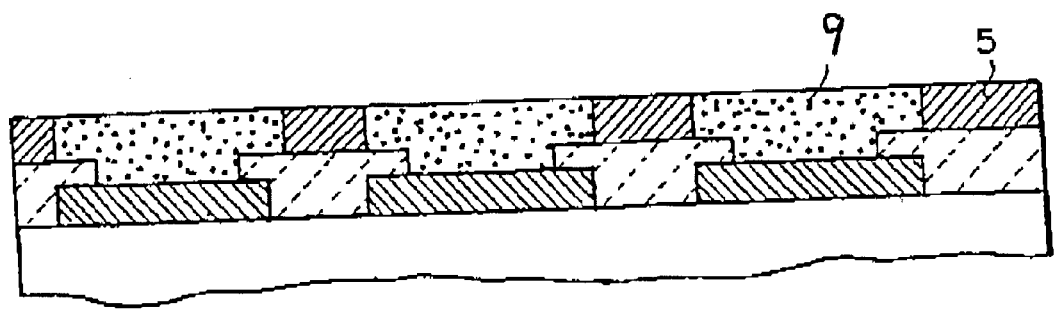

With reference to FIG. 7H, the metal bump paste 9 is again pressed under the pressure of not less than 6 Kgf/cm2 for not less than 10 minutes by use of the autoclave to remove foams from the metal bump paste 9 whereby the volume of the metal bump paste 9 is reduced. The processes of FIGS. 7E through 7G are repeated until a top level of the metal bump paste 9 corresponds to the top level of the etching dry film 5.

Figure 7I:
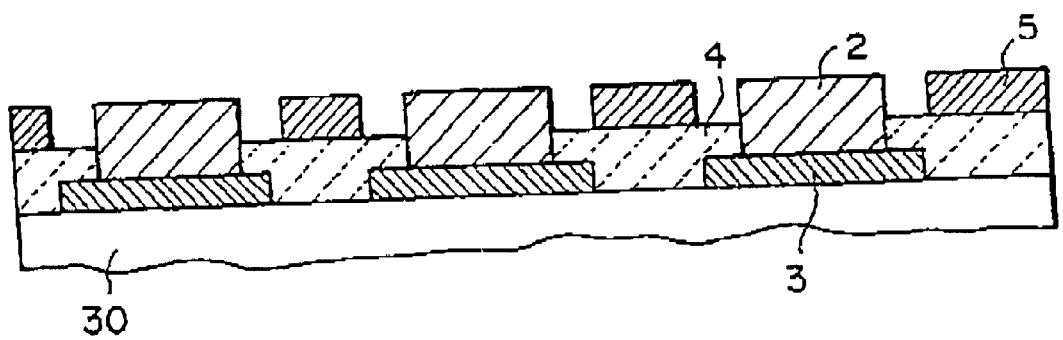

With reference to FIG. 7I, a baking is carried out to the solder paste 9 to form metal bumps 2 in the openings "A,". The baking process causes a cohesion of the solder paste 9 whereby the metal bumps 2 have almost the same size as the first openings 4a formed in the solder resist layer 4.

Figure 7J:
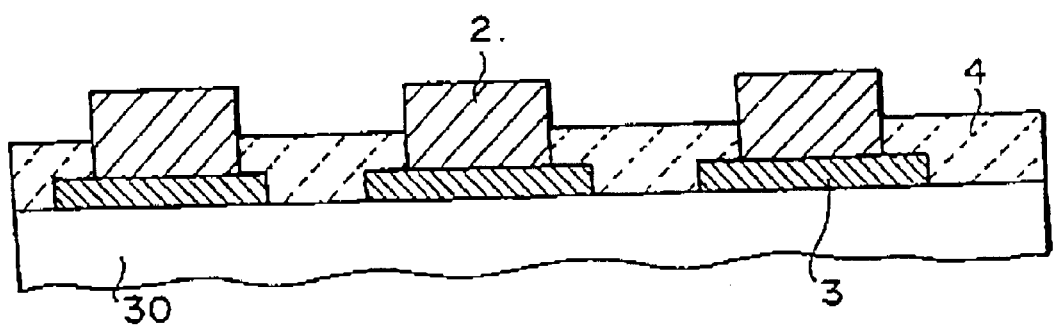

With reference to FIG. 7J, an alkali solvent such as a sodium hydrate or an organic solvent, for example, ethanol amine, is used to remove the etching dry film 5. A cleaning process is then carried out to form a mounting substrate.

A paste-printing is carried out by use of the dry film 5 over the solder resist layer 4 as a mask, for which reason even if the wiring board or substrate has a bending or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film 5 at a high accuracy, without using any further instrument.

Fifth Embodiment

A fifth embodiment according to the present invention will be described in detail with reference to the drawings. There will be described a novel mounting substrate with a solder resist layer electrode pads on the mounting substrate and solder or metal bumps on the electrode pads.

Figure 3:
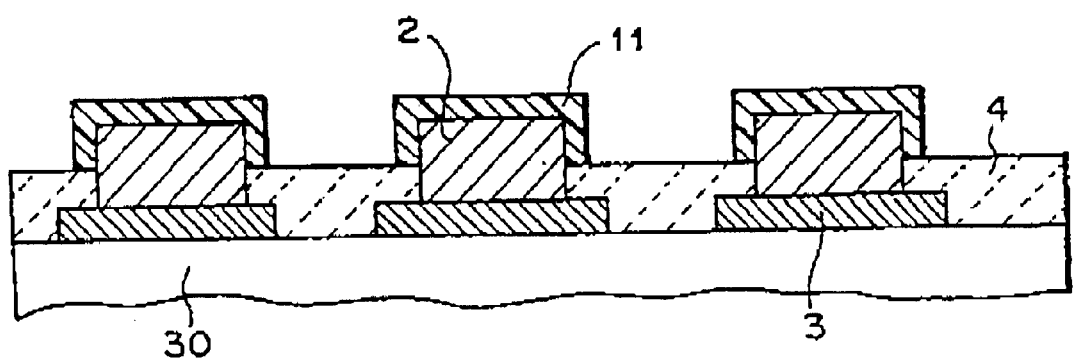
FIG. 3 is a fragmentary cross sectional elevation view illustrative of a plurality of electrode pads are provided on a surface of a wiring board in fifth and sixth embodiments in accordance with the present invention.

FIG. 3 is a fragmentary cross sectional elevation view illustrative of a plurality of electrode pads 3 are provided on a surface of a wiring board 30. Metal bumps 2 are provided on the electrode pads 3. An electrode comprises the electrode pad 3 and the metal bump 2. A solder resist layer 4 is provided which extends on the wiring board 30 to fill gaps between the electrodes, so that the electrode pads 3 and lower portions of the metal bumps 2 are coated within the solder resist layer 4. Tops of the metal bumps 2 are projected from the surface of the solder resist layer 4. A height of the individual tops of the metal bumps 2 from the surface of the solder resist layer 4 is uniform. A surface layer 11 is formed on a surface of each of the metal bumps 2, wherein the surface layer 11 may comprise a water-soluble pre-flux layer, a nickel-gold plated layer, a tin plated layer, a tin-silver plated layer or a palladium plated layer. The solder resist layer 4 comprises a permanent resin layer. The solder resist layer 4 mat further include other resin layer such as an additive plated resist layer.

The tops of the metal bumps 2 have a uniform height from the surface of the solder resist layer 4. Further, the solder resist layer 4 is provided which extends in gaps between adjacent electrodes. For those reasons, no short circuit such as bridge between adjacent electrodes is formed whereby a soldering workability is improved, FIGS. 8A through 8J are fragmentary cross sectional elevation view illustrative of a novel method of forming a mounting substrate with a solder resist and with electrode pads on the mounting substrate and metal bumps on the electrode pads shown in FIG. 3.

Figure 8:
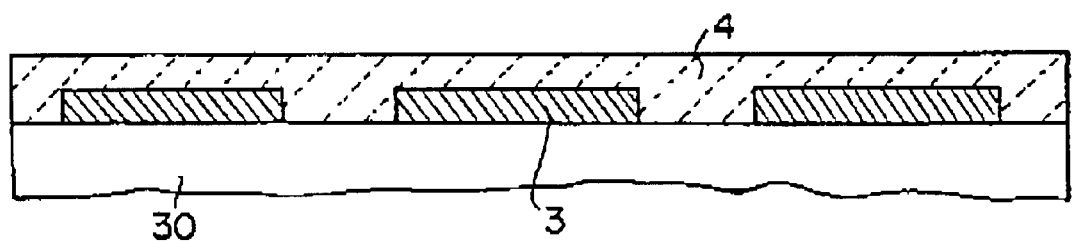
FIGS. 8A through 8J are fragmentary cross sectional elevation view illustrative of a novel method of forming a mounting substrate with a solder resist and with electrode pads on the mounting substrate and metal bumps on the electrode pads shown in FIG. 3 in a fifth embodiment in accordance with the present invention.
Figure 8:
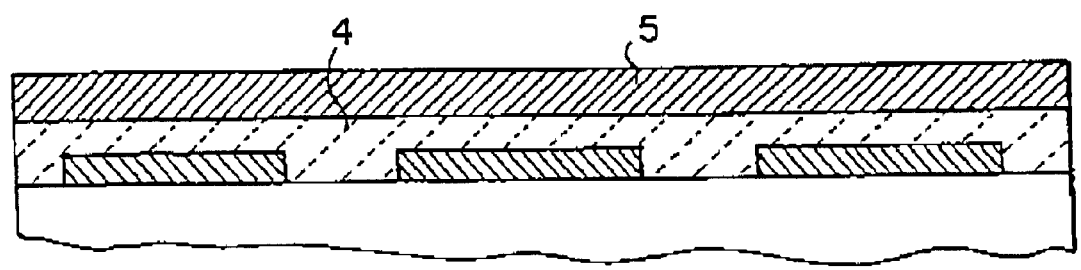
Figure 8:
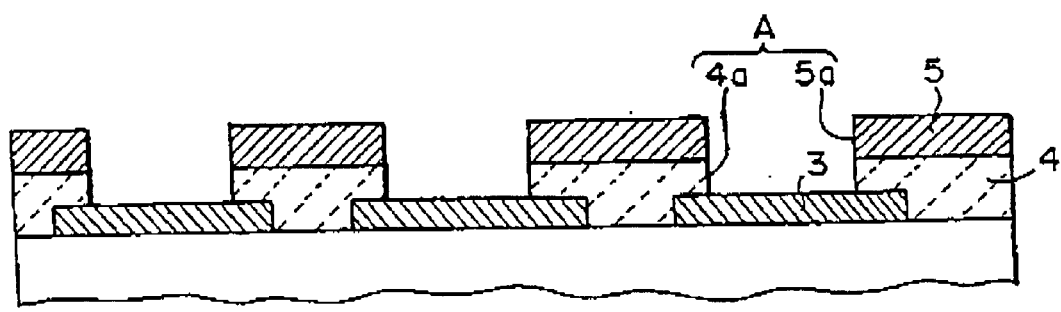
Figure 8:
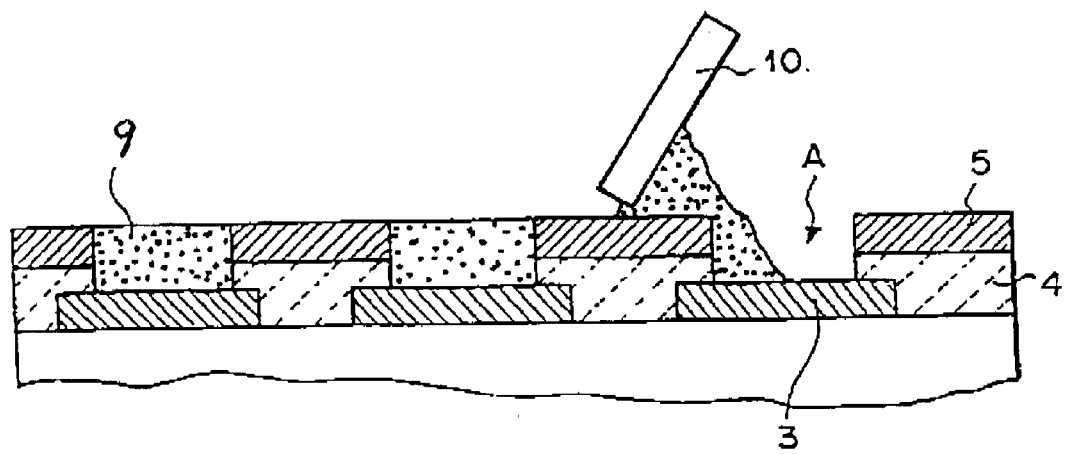
Figure 8:
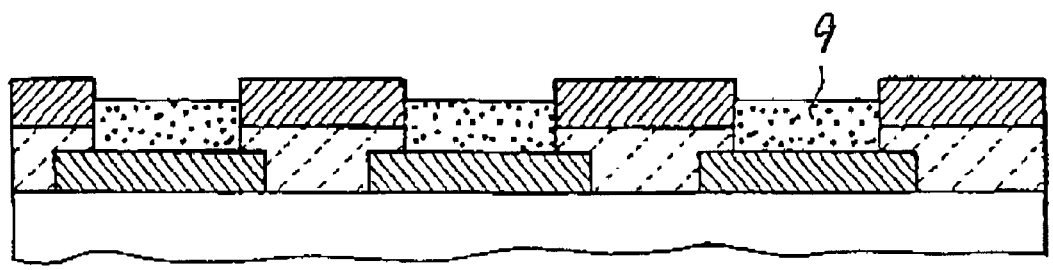
Figure 8:
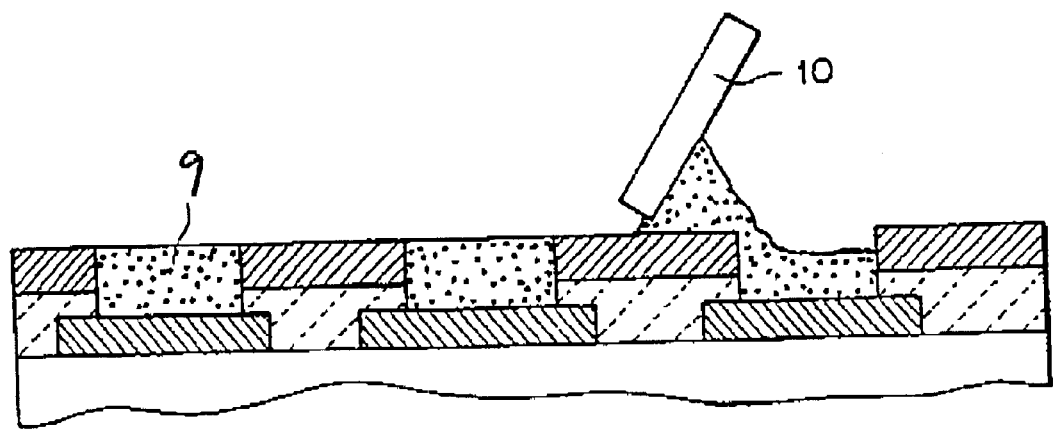
Figure 8:
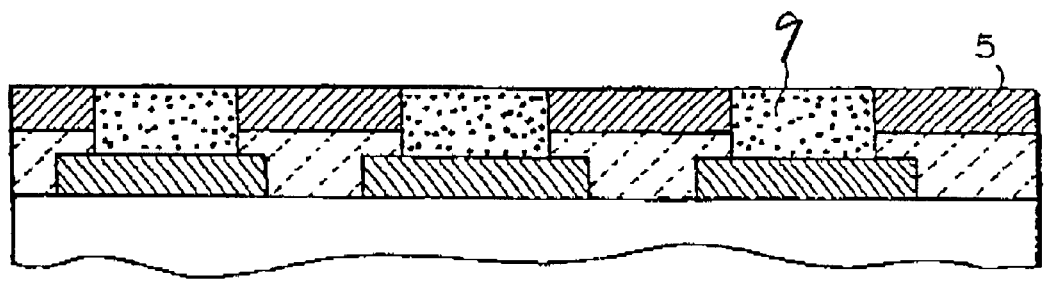
Figure 8:
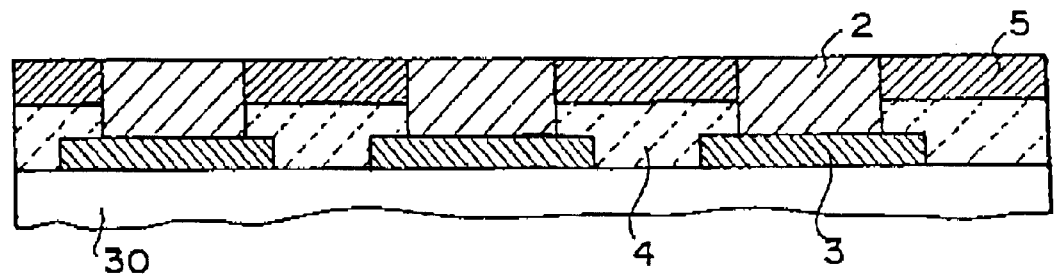
Figure 8:
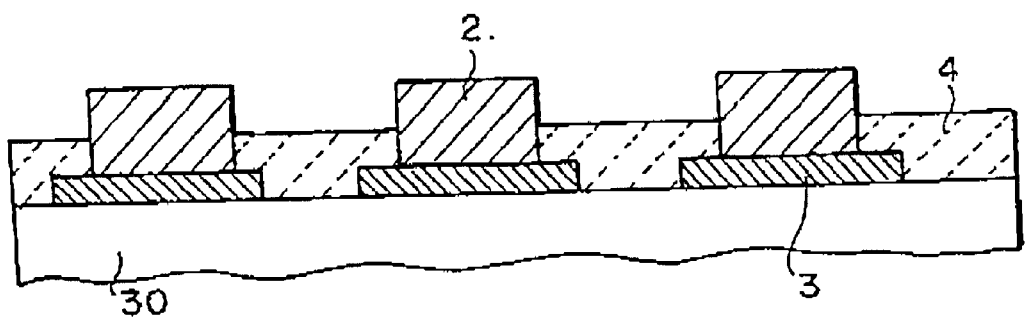

With reference to FIG. 8A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermosetting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the metal bumps 2, wherein the surface layer may comprise a water-soluble pre-flux layer, a nickel-gold plated layer, a tin plated layer, a tin-silver plated layer or a palladium plated layer.

With reference to FIG. 8B, an etching dry film 5 is formed on the solder resist layer 4. The etching dry film 5 may, for example, comprise an alkali-soluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a metal bump paste fills the openings. Further more alternatively, the Mylar film may be removed after a re-flow process for the metal bump paste.

With reference to FIG. 8C, a laser beam machining is used to form openings "A" which penetrate the etching dry film 5 and the solder resist layer 4 so that the openings "A" are positioned over the electrode pads 3, whereby a center portion of a surface of each of the electrode pads 3 is shown through the opening "A". A diameter of a size of the opening "A" is smaller than the electrode pad 3. The opening "A" comprises a first opening portion 4a formed in the solder resist layer 4 and a second opening portion 5a formed in the etching dry film 5. The formation of the first opening portion 4a follows the formation of the second opening portion 5a.

With reference to FIG. 8D, a squeegee 10 is used to print-supply a metal bump paste 9 into the openings "A" so that the openings "A" are filled with the metal bump taste 9.

With reference to FIG. 8E, the metal bump paste 9 is pressed under a pressure of not less than 6 Kgf/cm2 for not less than 10 minutes by use of an autoclave to remove foams from the metal bump paste 9 whereby a volume of the metal bump paste 9 is reduced.

With reference to FIG. 8F, the squeegee 10 is again used to print-supply the metal bump paste 9 into the openings "A" so that the openings "A" are completely filled with the metal bump taste 9.

With reference to FIG. 8G, the metal bump paste 9 is again pressed under the pressure of not less than 6 Kgf/cm2 for not less than 10 minutes by use of the autoclave to remove foams from the metal bump paste 9 whereby the volume of the metal bump paste 9 is reduced. The processes of FIGS. 8D through 8F are repeated until a top level of the metal bump paste 9 corresponds to the top level of the etching dry film 5.

With reference to FIG. 8H, a baking is carried out to the solder paste 9 to form metal bumps 2 in the openings "A".

With reference to FIG. 8I, an alkali solvent such as a sodium hydrate or an organic solvent, for example, ethanol amine, is used to remove the etching dry film 5. A cleaning process is then carried out.

Figure 8J:
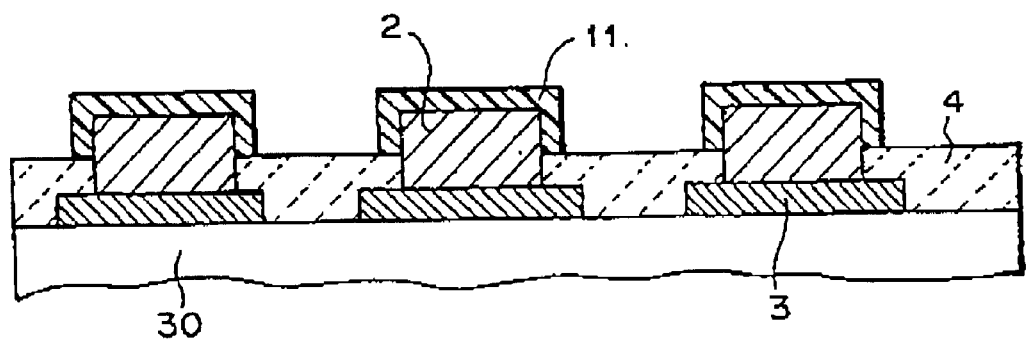

With reference to FIG. 8J, a surface layer 11 is formed on a surface of each of the metal bumps 2, wherein the surface layer may comprise a water-soluble pre-flux layer, a nickel-gold plated layer, a tin plated layer, a tin-silver plated layer or a palladium plated layer to form a mounting substrate, A paste-printing is carried out by use of the dry film 5 over the solder resist layer 4 as a mask, for which reason even if the wiring board or substrate has a bending or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film 5 at a high accuracy, without using any further instrument.

Sixth Embodiment

A sixth embodiment according to the present invention will be described in detail with reference to the drawings. The sixth embodiment is different only in the method of forming the mounting substrate from the fifth embodiment. The following descriptions will focus on the method of forming the mounting substrate.

FIGS. 9A through 9K are fragmentary cross sectional elevation view illustrative of a novel method of forming a mounting substrate with a solder resist and with electrode pads on the mounting substrate and metal bumps on the electrode pads shown in FIG. 3.

Figure 9A:
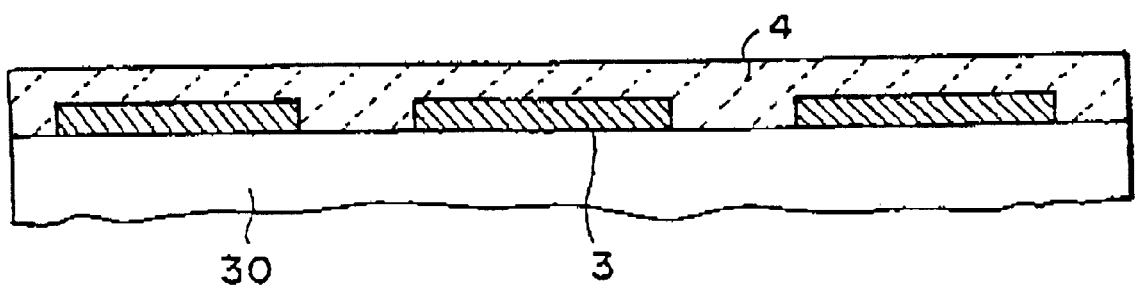
FIGS. 9A through 9K are fragmentary cross sectional elevation view illustrative of a novel method of forming a mounting substrate with a solder resist and with electrode pads on the mounting substrate and metal bumps on the electrode pads shown in FIG. 3.

With reference to FIG. 9A, a plurality of electrode pads 3 are formed on a surface of a wiring board 30. A solder resist layer 4 is formed over the surface of the wiring board 30 and the electrode pads 3, so that the solder resist layer 4 cover entire parts of the electrode pads 3. The solder resist layer 4 may be formed by applying a solder resist ink of a thermo-setting type or a photo-curing type in a screen printing method, a roll coating method, a curtain coat method or a spray coat method for subsequent curing the same. The solder resist layer 4 may have a thickness in the range of 20–50 micrometers. It may be possible to further form a surface layer on a surface of each of the metal bumps 2, wherein the surface layer may comprise a water-soluble pre-flux layer, a nickel-gold plated layer, a tin plated layer, a tin-silver plated layer or a palladium plated layer.

Figure 9B:
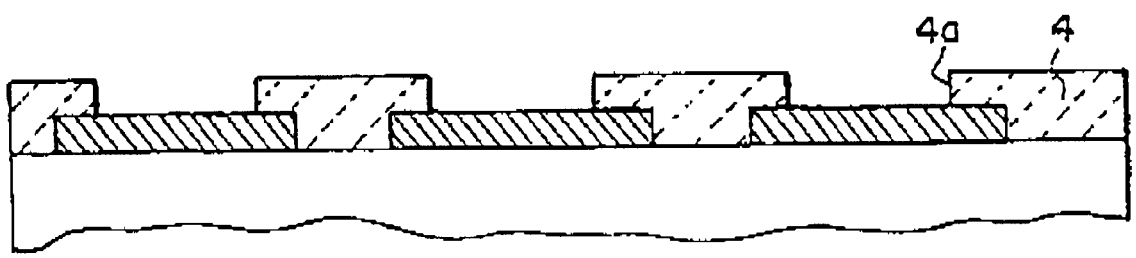

With reference to FIG. 9B, a laser beam machining is used to form openings 4a which penetrate the solder resist layer 4 so that the openings 4a are positioned over the electrode pads 3, whereby a center portion of a surface of each of the electrode pads 3 is shown through the opening 4a. A diameter of a size of the opening 4a is smaller than the electrode pad 3.

Figure 9C:
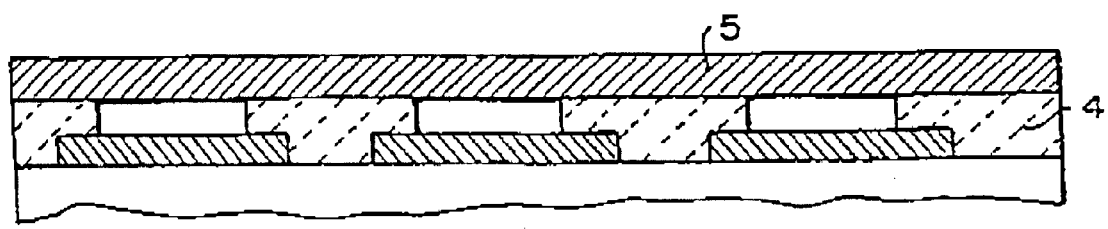

With reference to FIG. 9C, an etching dry film 5 is formed on the solder resist layer 4 and over the openings 4a. The etching dry film 5 may, for example, comprise an alkali-soluble photo-curing etching dry film. This etching dry film 5 may be adhered on the surface of the solder resist layer 4. For example, the etching dry film 5 may be adhered directly on the surface of the solder resist layer 4 by a heat crimping method or by using an appropriate adhesive. Alternatively, a heat resistive sheet with an adhesive, wherein the etching dry film 5 is sandwiched between an adhesive layer and a Mylar film. The Mylar film may immediately thereafter be removed. Alternatively, the Mylar film may be removed after openings have been formed in a later process. Further alternatively, the Mylar film may be removed after a metal bump paste fills the openings. Further more alternatively, the Mylar film may be removed after a re-flow process for the metal bump paste.

Figure 9D:
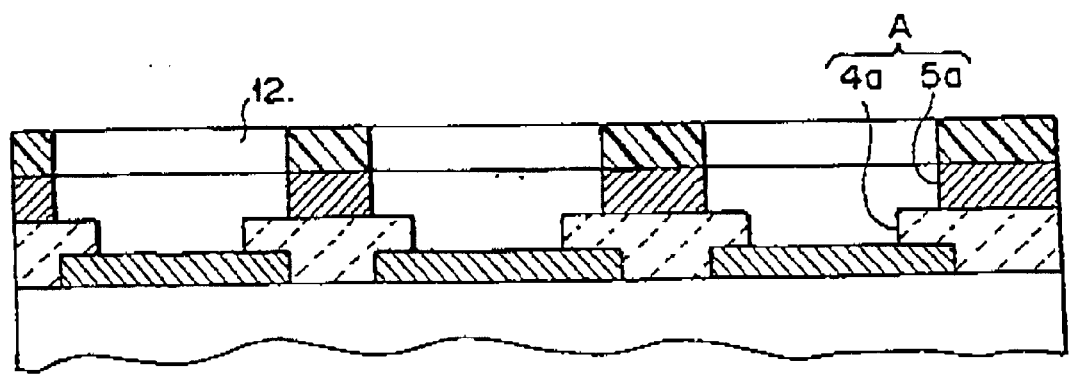
Figure 9:
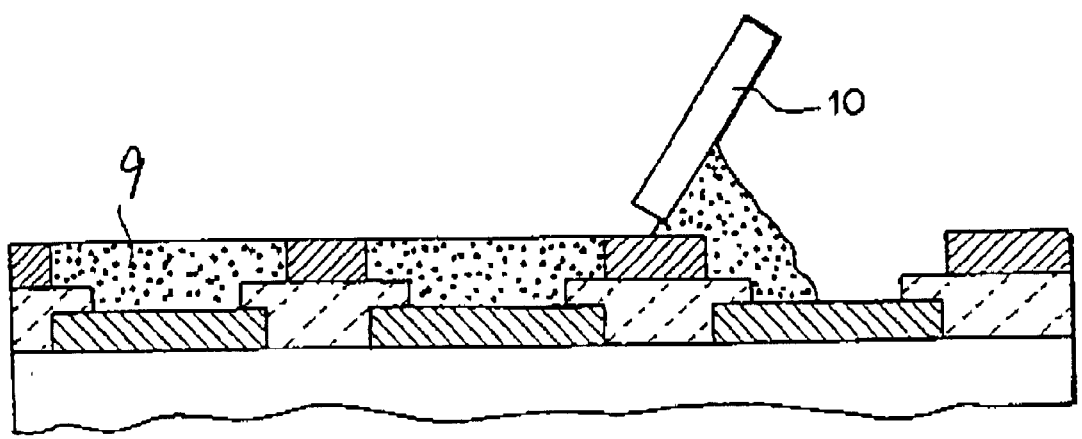
Figure 9:
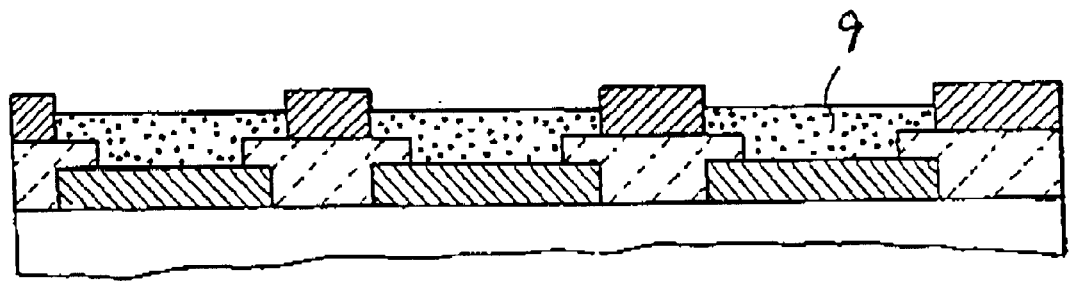
Figure 9:
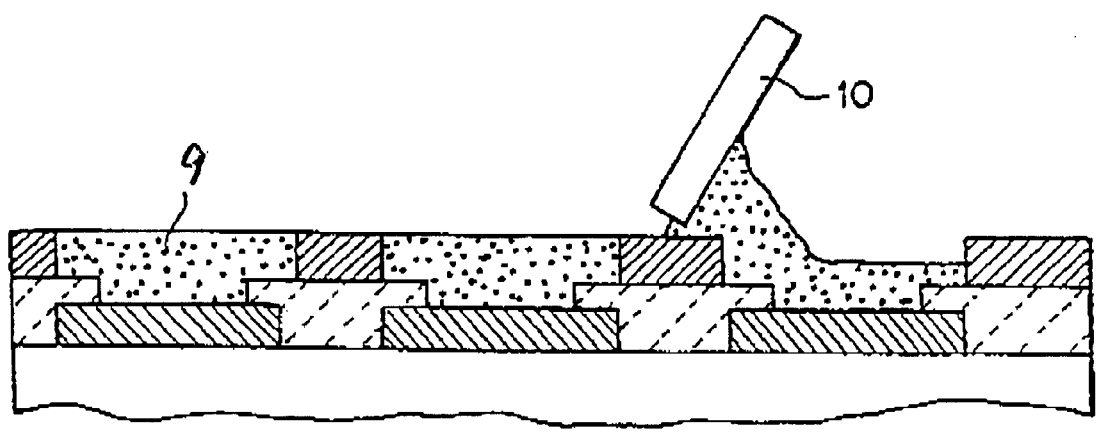
Figure 9:
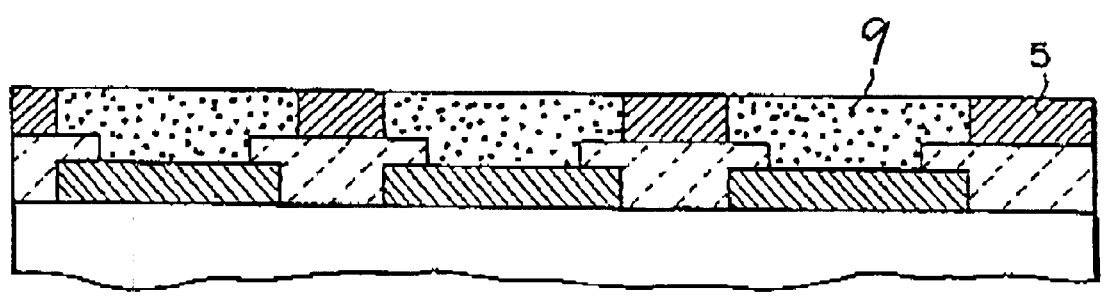
Figure 9:
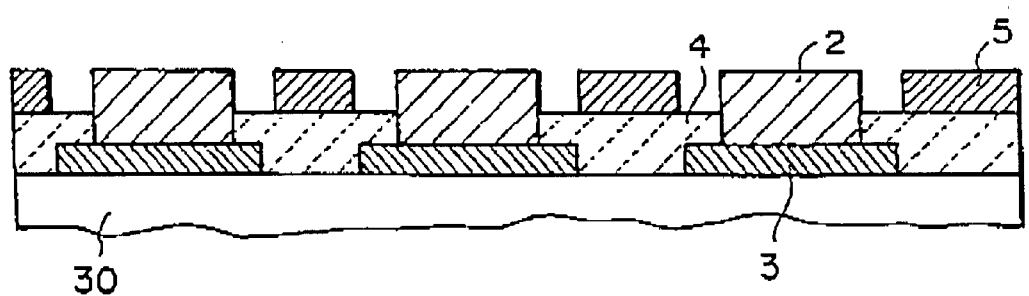

With reference to FIG. 9D, an exposure mask 12 is formed on the etching dry film 5 so that an exposure to the etching dry film 5 and a subsequent development thereof are carried out by use of the exposure mask 12 so as to form openings 5a in the etching dry film 5 over the openings 4a. The openings 5a have a larger diameter than a diameter of the openings 4a. Openings "A" are therefore formed, wherein each of the openings "A" comprises the first opening 4a formed in the solder resist layer 4 and the second opening 5a formed in the etching dry film 5. The used exposure mask 12 is removed.

With reference to FIG. 9E, a squeegee 10 is used to print-supply a metal bump paste 9 into the openings "A" so that the openings "A" are filled with the metal bump taste 9.

With reference to FIG. 9F, the metal bump paste 9 is pressed under a pressure of not less than 6 Kgf/cm2 for not less than 10 minutes by use of an autoclave to remove foams from the metal bump paste 9 whereby a volume of the metal bump paste 9 is reduced.

With reference to FIG. 9G, the squeegee 10 is again used to print-supply the metal bump paste 9 into the openings "A" so that the openings "A" are completely filled with the metal bump taste 9.

With reference to FIG. 9H, the metal bump paste 9 is again pressed under the pressure of not less than 6 Kgf/cm2 for not less than 10 minutes by use of the autoclave to remove foams from the metal bump paste 9 whereby the volume of the metal bump paste 9 is reduced. The processes of FIGS. 9E through 9G are repeated until a top level of the metal bump paste 9 corresponds to the top level of the etching dry film 5.

With reference to FIG. 9I, a baking is carried out to the solder paste 9 to form metal bumps 2 in the openings "A". The baking process causes a cohesion of the solder paste 9 whereby the metal bumps 2 have almost the same size as the first openings 4a formed in the solder resist layer 4.

Figure 9J:
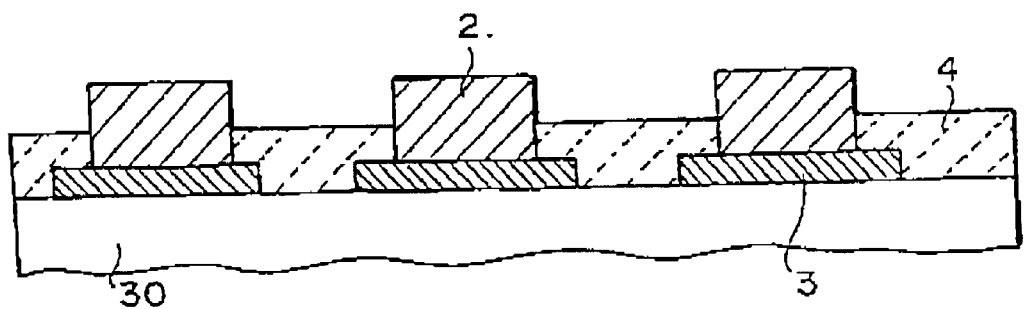

With reference to FIG. 9J, an alkali solvent such as a sodium hydrate or an organic solvent, for example, ethanol amine, is used to remove the etching dry film 5. A cleaning process is then carried out to form a mounting substrate.

Figure 9K:
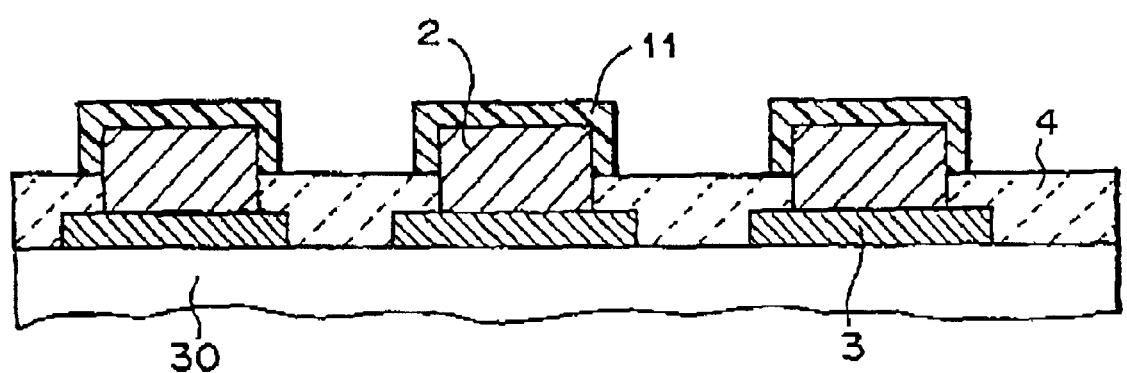

With reference to FIG. 9K, a surface layer 11 is formed on a surface of each of the metal bumps 2, wherein the surface layer may comprise a water-soluble pre-flux layer, a nickel-gold plated layer, a tin plated layer, a tin-silver plated layer or a palladium plated layer to form a mounting substrate.

A paste-printing is carried out by use of the dry film 5 over the solder resist layer 4 as a mask, for which reason even if the wiring board or substrate has a bending or a twisting, a highly accurate co-planarity can be obtained and a uniform amount of the paste can be supplied to the individual openings to form the bumps. It is further possible to prevent any bleeding of the paste. Further since the mask pattern is formed over the wiring board, high accuracy in position of the openings or the bumps can be obtained.

The etching dry film 5 used as the mask pattern is removed, so that no solder exists on the top surface of the solder resist layer, whereby good properties of the solder resist layer can be obtained.

The widely used process for forming the semiconductor substrate can be applied to the formation of the mask pattern of the etching dry film at a high accuracy, without using any further instrument.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of preparing a substrate structure, comprising:
supplying a paste in openings formed over electrode pads on a substrate by using a mask of an etching dry film formed on a solder resist layer, wherein each of said opening comprises a first opening portion formed in a solder resist layer and a second opening portion formed in said mask, and
wherein each of said openings is smaller in horizontal size than a corresponding one of said electrode pads, such that said paste supplied in each opening is defined in a region of a corresponding electrode pad other than on a peripheral region of said electrode pad.

2. The method as claimed in claim 1, wherein said first and second opening portions are formed after said etching dry film is formed on said solder resist layer.

3. The method as claimed in claim 2, wherein said first and second opening portions have the same diameters as each other.

4. The method as claimed in claim 1, wherein after said first opening portions are formed in said solder resist layer, said etching dry film is formed on said solder resist layer and over said first opening portions before said second opening portions are then formed in said etching dry film.

5. The method as claimed in claim 4, wherein said second opening portions have a larger diameter than said first opening portions.

6. The method as claimed in claim 4, wherein said second opening portions are formed in said etching dry film by exposure to said etching dry film with using of an exposure mask and a subsequent development thereof.

7. The method as claimed in claim 1, wherein a squeegee is used to supply said paste into said openings.

8. The method as claimed in claim 1, wherein after said paste is supplied in said openings, said paste is pressed to remove foams from said paste and a fresh paste is additionally supplied to completely fill said openings with said paste.

9. The method as claimed in claim 1, wherein said paste comprises a solder bump paste.

10. The method as claimed in claim 1, wherein said paste comprises a metal bump paste.

11. A method of making a substrate structure, comprising:
forming a plurality of electrode pads on a substrate;
forming a solder resist layer over said substrate so as to completely cover said electrode pads;
forming an etching dry film on said solder resist layer;
forming openings including first opening portion in said solder resist layer and second opening portions in said etching dry film,
said first opening portions and said second opening portions having a same size as each other, and said openings are positioned over said electrode pads, wherein each of said openings is smaller in horizontal size than a corresponding one of said electrode pads;
supplying pastes in said openings by using a mask of said etching dry film so that said paste supplied in said opening is defined in a region of said each electrode pad other than a peripheral region of said electrode pad;
making said pastes into a plurality of solder portions to form said solder in said openings such that each said solder portion is smaller in horizontal size than a corresponding one of said electrode pads; and
removing said etching dry film.

12. The method as claimed in claim 11, a squeegee is used to supply said pastes into said openings.

13. The method as claimed in claim 11, wherein after said paste is supplied in said openings, said paste is pressed to remove foams from said paste and a fresh paste is additionally supplied to completely fill said openings with said paste.

14. The method as claimed in claim 11, wherein said paste comprises a solder bump paste.

15. The method as claimed in claim 11, wherein said paste comprises metal bump paste.

16. The method as claimed in claim 11, further comprising a step of forming a surface layer on a surface of each of said bumps projecting from a surface of said solder resist layer.

17. A method of making a substrate structure, comprising:

forming electrode pads on a substrate;

forming a solder resist layer over said substrate so as to completely cover said electrode pads;

forming first opening portions in said solder resist layer so that said first opening portions are positioned over said electrode pads;

forming an etching dry film on said solder resist layer and over said first opening portions;

forming second opening portions in said etching dry film over said first opening portions to form openings comprising said first and second opening portions, wherein said first opening portion has a smaller horizontal size than that of said electrode pad;

supplying pastes in said openings by using a mask of said etching dry film making said pastes into solder portions to form said solder portions in said openings; and removing said etching dry film.

18. The method as claimed in claim 17, a squeegee is used to supply said pastes into said openings.

19. The method as claimed in claim 17, wherein after said paste is supplied in said openings, said paste is pressed to remove foams from said paste and a fresh paste is additionally supplied to completely fill said openings with said paste.

20. The method as claimed in claim 17, wherein said second opening portions are formed in said etching dry film by exposure to said etching dry film with using of an exposure mask and a subsequent development thereof.

21. The method as claimed in claim 17, wherein said paste comprises a solder bump paste.

22. The method as claimed in claim 17, wherein said paste comprises a metal bump paste.

23. The method as claimed in claim 17, further comprising a step of forming a surface layer on a surface of each of said bumps projecting from a surface of said solder resist layer.

24. The method of making a substrate structure of claim 17 wherein said pastes supplied in said openings is defined in a region vertically adjacent to a top surface of said electrode pads other than on a peripheral region of said electrode pads.

25. A method of preparing a substrate structure, comprising:

supplying a paste in an opening formed over an electrode pad on a substrate by using a mask of an etching dry film formed on a solder resist layer, wherein said opening comprises a first opening portion formed in a solder resist layer and a second opening portion formed in said mask, and wherein said opening is equal to or smaller in horizontal size than a corresponding one of said electrode pad, such that said paste supplied said opening is defined in a region of a corresponding electrode pad other than on a peripheral region of said electrode pad.

26. The method of preparing a substrate structure of claim 19 wherein said second opening portion is the same horizontal size as said first opening portion.

27. The method of preparing a substrate structure of claim 20 wherein said second opening portion is larger than the horizontal size of said first opening portion.

* * * * *